United States Patent
Shin et al.

(10) Patent No.: US 8,207,594 B2
(45) Date of Patent: Jun. 26, 2012

(54) SEMICONDUCTOR INTEGRATED CIRCUIT DEVICE

(75) Inventors: Dong Suk Shin, Yongin-si (KR); Chong-Kwang Chang, Bucheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 236 days.

(21) Appl. No.: 12/702,618

(22) Filed: Feb. 9, 2010

(65) Prior Publication Data

US 2010/0200929 A1    Aug. 12, 2010

(30) Foreign Application Priority Data

Feb. 9, 2009 (KR) .................. 10-2009-0010238

(51) Int. Cl.
*H01L 29/40* (2006.01)

(52) U.S. Cl. ........ 257/621; 438/106; 438/107; 438/629; 438/637; 438/653; 257/751; 257/E23.011; 257/E21.499

(58) Field of Classification Search .................. 438/266, 438/197, 618, 598, 624, 626, 631, 692, 740, 438/192, 457, 689; 257/384, E29.255, 503, 257/48, 369
See application file for complete search history.

(56) References Cited

U.S. PATENT DOCUMENTS

| | | | | |
|---|---|---|---|---|
| 5,546,204 A * | 8/1996 | Ellis | ................................. | 349/46 |
| 5,623,438 A * | 4/1997 | Guritz et al. | .................. | 438/598 |
| 5,909,059 A * | 6/1999 | Hada et al. | .................... | 257/750 |
| 6,927,461 B2 * | 8/2005 | Kim et al. | ...................... | 257/382 |
| 7,084,458 B1 * | 8/2006 | Khan et al. | ..................... | 257/336 |
| 7,312,144 B2 * | 12/2007 | Cho et al. | ...................... | 438/618 |
| 7,544,555 B2 * | 6/2009 | Koike | .......................... | 438/197 |
| 7,633,079 B2 * | 12/2009 | Chen et al. | ......................... | 257/4 |
| 7,663,193 B2 * | 2/2010 | Tsuboi et al. | ................. | 257/369 |
| 7,763,534 B2 * | 7/2010 | Smayling et al. | ............. | 438/599 |
| 7,838,359 B2 * | 11/2010 | Schwan et al. | ................ | 438/233 |
| 7,868,359 B2 * | 1/2011 | Takahashi | ..................... | 257/204 |
| 8,030,163 B2 * | 10/2011 | Pillarisetty et al. | ........... | 438/283 |
| 8,035,169 B2 * | 10/2011 | Ishida et al. | ................... | 257/401 |
| 8,043,888 B2 * | 10/2011 | Mathew et al. | ................ | 438/102 |
| 2002/0130344 A1 * | 9/2002 | Nii et al. | ........................ | 257/297 |
| 2002/0145156 A1 * | 10/2002 | Igarashi et al. | ................ | 257/262 |
| 2003/0006444 A1 * | 1/2003 | Amo et al. | ..................... | 257/296 |
| 2004/0061175 A1 * | 4/2004 | Fukuda | ......................... | 257/347 |
| 2005/0029664 A1 * | 2/2005 | Cho et al. | ...................... | 257/758 |
| 2005/0106818 A1 * | 5/2005 | Shih | .............................. | 438/266 |

(Continued)

FOREIGN PATENT DOCUMENTS

JP    62-219965    9/1987

(Continued)

*Primary Examiner* — N Drew Richards
*Assistant Examiner* — Ankush Singal
(74) *Attorney, Agent, or Firm* — F. Chau & Associates, LLC

(57) ABSTRACT

A semiconductor integrated circuit memory device includes a gate line that extends in a first direction, an active region adjacent to a first end of the gate line and that extends in a second direction, a silicide layer formed on a top surface of the active region, on a top surface of the gate line, on both sidewalls of the first end of the gate line, and on a transverse endwall of the first end of the gate line. A spacer may be formed on sidewalls of the gate line, excluding the first end of the gate line, and a contact shared by the active region may be formed on the first end of the gate line.

14 Claims, 17 Drawing Sheets

U.S. PATENT DOCUMENTS

| | | | | |
|---|---|---|---|---|
| 2006/0286740 | A1* | 12/2006 | Lin et al. | 438/231 |
| 2007/0007617 | A1* | 1/2007 | Nakamura et al. | 257/503 |
| 2007/0010052 | A1* | 1/2007 | Huang et al. | 438/199 |
| 2007/0023832 | A1* | 2/2007 | Matsui | 257/344 |
| 2007/0161171 | A1* | 7/2007 | Burnett et al. | 438/197 |
| 2007/0210306 | A1* | 9/2007 | Molinelli Acocella et al. | 257/48 |
| 2007/0262350 | A1* | 11/2007 | Nagase | 257/206 |
| 2008/0044632 | A1* | 2/2008 | Liu et al. | 428/192 |
| 2008/0102612 | A1* | 5/2008 | Dyer et al. | 438/533 |
| 2008/0128825 | A1* | 6/2008 | Sato et al. | 257/369 |
| 2008/0158942 | A1* | 7/2008 | Nirschl et al. | 365/163 |
| 2008/0186760 | A1* | 8/2008 | Elmegreen et al. | 365/163 |
| 2008/0237586 | A1* | 10/2008 | Sun et al. | 257/48 |
| 2008/0308883 | A1* | 12/2008 | Hong | 257/412 |
| 2009/0108379 | A1* | 4/2009 | Oosuka et al. | 257/412 |
| 2009/0166762 | A1* | 7/2009 | Ou | 257/408 |
| 2009/0167319 | A1* | 7/2009 | Lee et al. | 324/555 |
| 2009/0278183 | A1* | 11/2009 | Lee | 257/296 |
| 2010/0117158 | A1* | 5/2010 | Koide | 257/369 |
| 2010/0224942 | A1* | 9/2010 | Lim | 257/384 |

FOREIGN PATENT DOCUMENTS

| | | |
|---|---|---|
| JP | 2007-027348 | 2/2007 |
| KR | 1020010061532 | 7/2001 |

* cited by examiner

SEMICONDUCTOR INTEGRATED CIRCUIT DEVICE

This application claims priority, under 35 U.S.C. §119, of Korean Patent Application No. 10-2009-0010238 filed on Feb. 9, 2009 in the Korean Intellectual Property Office, which is incorporated by reference herein in its entirety.

BACKGROUND

1. Field of the Invention

The present invention relates to a semiconductor integrated circuit device, and more particularly, to a semiconductor integrated circuit (IC) memory device with enhanced reliability.

2. Description of the Related Art

Static random access memories (SRAMs) have a smaller memory capacity for a given chip area but a higher operating speed than dynamic random access memories (DRAMs). Accordingly, SRAMs are widely used in cache memories of computers or portable appliances that are required to operate at high speed.

SRAM cells are divided into thin-layer transistor (TFT) cells and full complementary metal oxide semiconductor (FCMOS) cells. An FCMOS cell includes a plurality of cross-connected pull-up transistors and pull-down transistors that constitute a latch and a plurality of pass transistors that access the latch.

As semiconductor memory devices become more highly integrated, memory cells are becoming smaller. As the size of memory cells decreases, the size of metal contacts in them is also decreasing. However, a decrease in the size of the metal contacts makes it difficult to accurately pattern the metal contacts, resulting in an increase in the occurrence of defective contacts. In particular, adjacent ones of shared contacts formed in SRAM cells tend to be easily electrically connected (shorted) to each other, also known as bridged.

SUMMARY

Aspects of the present invention provide a semiconductor integrated circuit device with improved reliability and productivity.

According to an aspect of the present invention, there is provided a semiconductor integrated circuit device including: a gate line that extends in a first direction; an active region adjacent to a first end of the gate line and that extends in a second direction; a silicide layer formed on a top surface of the active region, on a top surface of the gate line, on both sidewalls of the first end of the gate line, and on a transverse endwall of the first end of the gate line; a spacer formed on sidewalls of the gate line, excluding the first end of the gate line; and a shared contact formed on the first end of the gate line.

According to another aspect of the present invention, there is provided a semiconductor integrated circuit device including: a substrate in which an element isolation region and an active region are formed; a gate insulating layer formed on the substrate; a gate electrode formed on the gate insulating layer; a silicide layer formed on the active region and both sidewalls and a top surface of the gate electrode; and a shared contact formed on the gate electrode to be electrically connected to the active region and the gate electrode.

An aspect of the present invention provides a semiconductor memory integrated circuit comprising: a gate line that extends in a first direction and has a first end and a second end and a first side and a second side; an active region that extends in a second direction; a silicide layer formed conformally on a top surface of the active region, on a top surface of the gate line, on both sidewalls at the first end of the gate line, and on a transverse endwall at the first end of the gate line; and a contact formed on the gate line electrically connected to the active region through the silicide layer. The shared contact may be square. The active region may be overlapped by the first end of the gate line. A first contact may be formed on the source of a transistor formed in the active region, and the size of the shared contact may be substantially the same as the size of the first contact.

Other features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, well-known structures and well-known technologies will not be specifically described in order to avoid ambiguous interpretation of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like reference numerals refer to like elements throughout the specification. As used herein, the term "and/or" and the forward slash "/" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and will not be interpreted in an idealized or overly formal sense unless expressly so defined herein.

Spatially relative terms, such as "below," "beneath," "lower," "above," "upper," "overlapping" and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
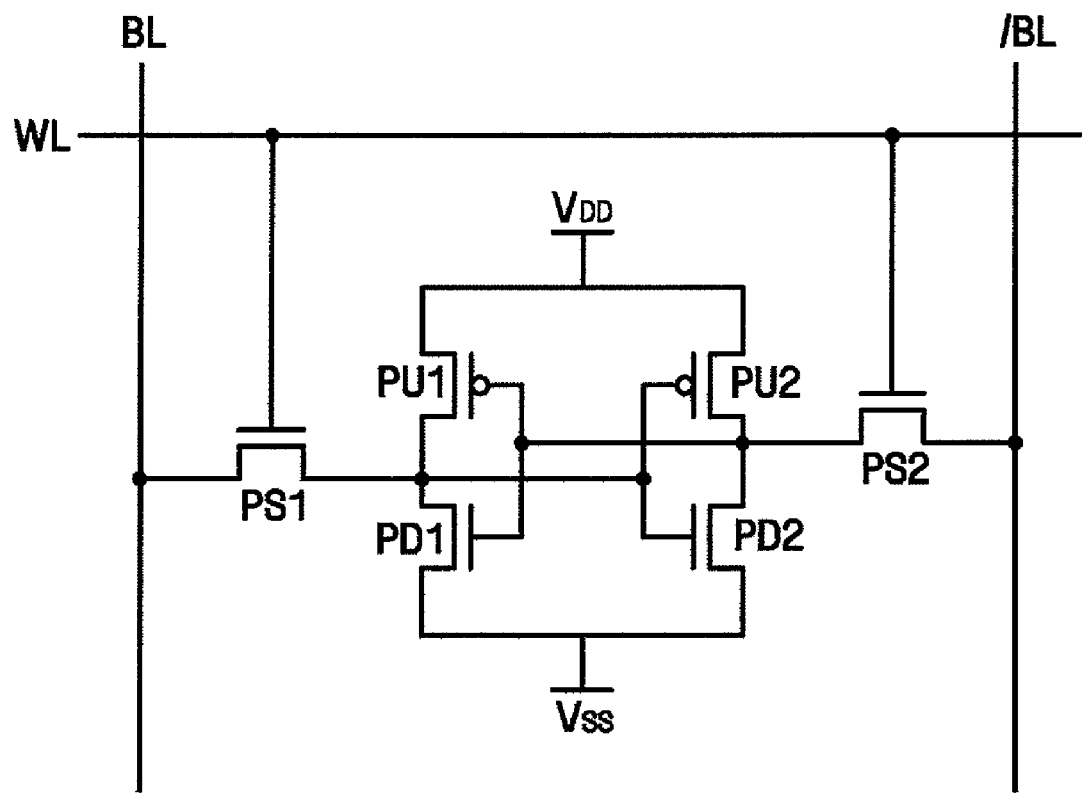
FIG. 1 is a circuit diagram of a static random access memory (SRAM) cell included in a semiconductor integrated circuit (IC) memory device according to exemplary embodiments of the present invention.

FIG. 1 is a circuit diagram of a static random access memory (SRAM) cell included in a semiconductor integrated circuit (IC) memory device according to exemplary embodiments of the present invention.

Referring to FIG. 1, the semiconductor integrated circuit device according to the exemplary embodiments includes a six-transistor SRAM cell. The SRAM cell includes a plurality of (e.g., two) pull-up transistors PU1 and PU2 and a plurality of (e.g., two) pull-down transistors PD1 and PD2 which constitute a latch and a plurality of (e.g., two) pass transistors PS1 and PS2 which access the latch.

Each SRAM memory cell includes first and second pass transistors PS1 and PS2, first and second pull-down transistors PD1 and PD2, and first and second pull-up transistors PU1 and PU2. The first and second pass transistors PS1 and PS2 and the first and second pull-down transistors PD1 and PD2 are n-channel metal oxide semiconductor (NMOS) transistors, and the first and second pull-up transistors PU1 and P2 are p-channel metal oxide semiconductor (PMOS) transistors.

The sources of the first and second pull-down transistors PD1 and PD2 are connected to a ground line VSS, and the sources of the first and second pull-up transistors PU1 and PU2 are connected to a voltage source line VDD.

The first pull-down transistor PD1, which is an NMOS transistor, and the first pull-up transistor PU1, which is a PMOS transistor, form a first inverter. In addition, the second pull-down transistor PD2, which is an NMOS transistor, and the second pull-up transistor PU2, which is a PMOS transistor, form a second inverter. The first inverter and the second inverter are connected input-to-output. Thus, the output terminal of the first inverter is connected to the input terminal of the second inverter, and vice versa. Thus input and output terminals of the first and second inverters are connected together to cross each other so as to form one latch circuit.

Output terminals of the first and second inverters are connected to sources of the first and second pass transistors PS1 and PS2, respectively. In addition, input terminals of the first and second inverters are connected to sources of the first and second pass transistors PS2 and PS1, respectively.

The drains of the first and second pass transistors PS1 and PS2 are connected to first and second bit lines BL and /BL, respectively.

Hereinafter, a semiconductor integrated circuit (IC) memory device according to a first exemplary embodiment of the present invention will be described in detail with reference to FIGS. 2A through 3B.

Figure 2A:
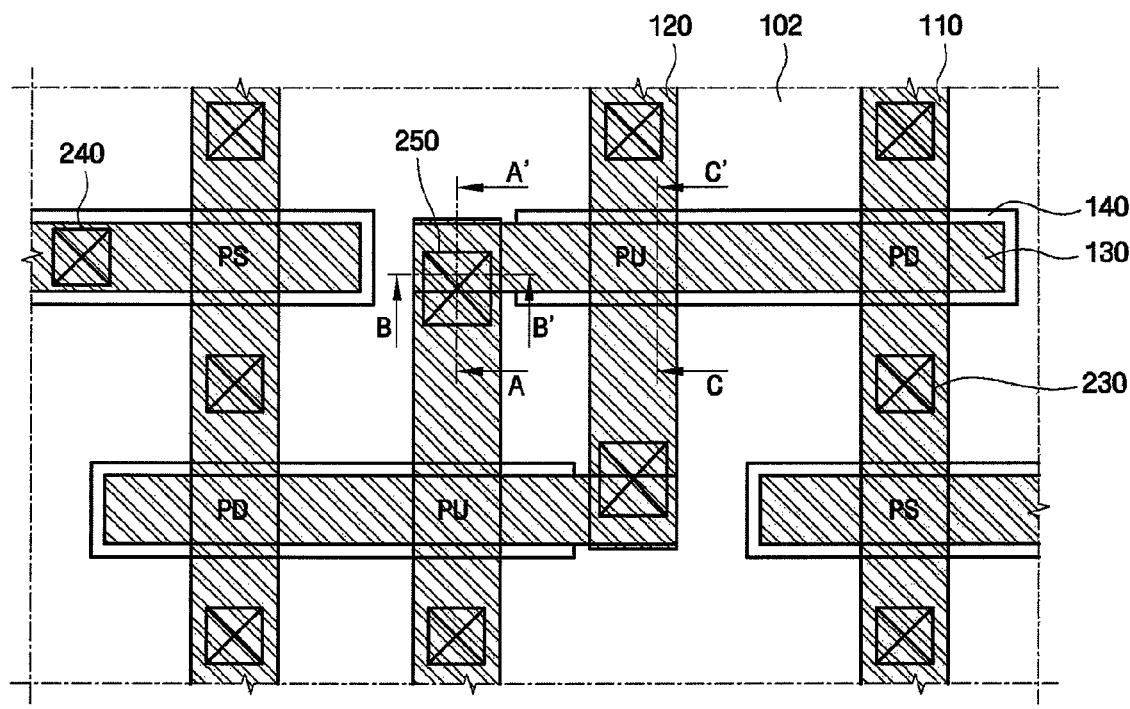
FIG. 2A is a layout diagram of an SRAM cell region included in a semiconductor integrated circuit (IC) memory device according to a first exemplary embodiment of the present invention.
Figure 2B:
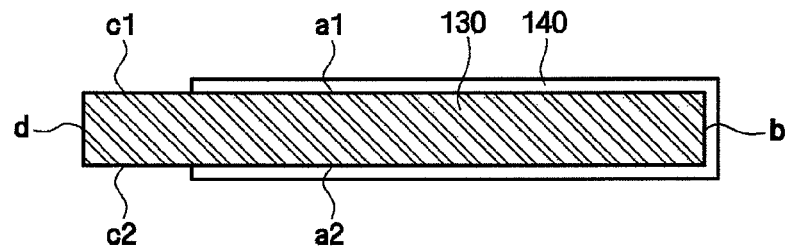
FIG. 2B is a detail diagram of elements 130 and 140 of FIG. 2A.
Figure 3A:
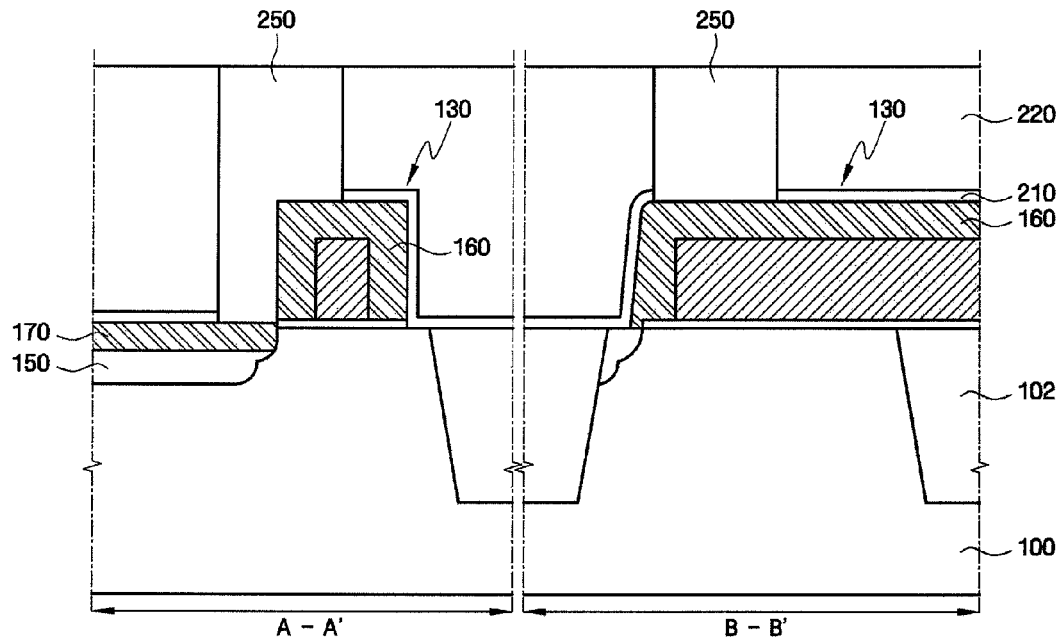
FIG. 3A is a cross-sectional view of the SRAM cell region taken along the section lines A-A' and B-B' in FIG. 2A.
Figure 3B:
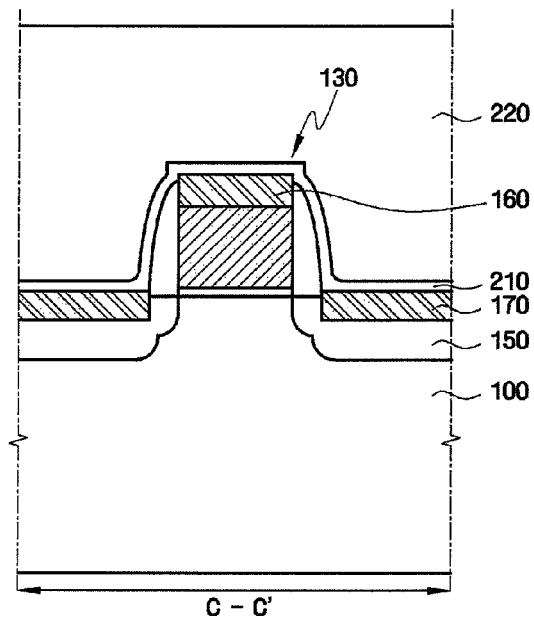
FIG. 3B is a cross-sectional view of the SRAM cell region taken along the section line C-C' in FIG. 2A.

FIG. 2A is a layout diagram of an SRAM cell region included in the semiconductor integrated circuit (IC) memory device according to the first exemplary embodiment of the present invention. FIG. 2B is a detail diagram of elements 130 and 140 of FIG. 2A for explaining FIG. 2A in greater detail. FIG. 3A is a cross-sectional view of the SRAM cell region taken along the section lines A-A' and B-B' in FIG. 2A. FIG. 3B is a cross-sectional view of the SRAM cell region taken along the section line C-C' in FIG. 2A.

Referring to FIGS. 2A through 3B, the semiconductor integrated circuit device according to the first exemplary embodiment includes a plurality of active regions 110 of a first conductivity type extend in a first direction, which are separated from each other by element isolation regions 102, and a plurality of active regions 120 of a second conductivity type which are separated from the active regions 110 of the first conductivity type in the first direction. The active regions 120 of the second conductivity type extend in the same first direction for a shorter distance than the active regions 110 of the first conductivity type. The active regions 110 of the first conductivity type may be N-type active regions, and the active regions 120 of the second conductivity type may be P-type active regions.

A plurality of gate lines 130 extend in a second direction (e.g., perpendicular to the first direction) and cross the active regions 110 of the first conductivity type or the active regions 120 of the second conductivity type. The gate lines 130 extend in the second direction and are adjacent to each other in the first direction. An end of each of the gate lines 130 may be adjacent to one of the active regions 110 of the first conductivity type or to one of the active regions 120 of the second conductivity type or may partially overlap one of the active regions 110 of the first conductivity type or one of the active regions 120 of the second conductivity type.

Referring to FIGS. 2A and 2B, a spacer 140 is formed on both longitudinal sidewalls a1 and a2 of each of the gate lines 130. The spacer 140 is formed on the longitudinal sidewalls a1 and a2 of each of the gate lines 130, excluding an end (hereinafter, referred to as a first end) of each of the gate lines 130, and is formed on a transverse endwall "b" of the other end (hereinafter, referred to as a second end) of each of the gate lines 130. The first end of each of the gate lines 130 on which the spacer 140 is not formed may lap one of shared contacts 250. Thus, the spacer 140 is not formed on the first end of each of the gate lines 130. Specifically, the spacer 140 is not formed on both longitudinal sidewalls c1 and c2 of the first end of each of the gate lines 130 nor on a transverse endwall "d" of the first end thereof.

In FIGS. 2A and 2B, the spacer 140 is not formed only on the first end of each of the gate lines 130. However, the present invention is not limited thereto, and the spacer 140 may also be not formed on the first and second ends of each of the gate lines 130.

Referring to FIGS. 2A, 2B and 3A and 3B, silicide layers 160 and 170 are formed on top surfaces of the active regions 110 of the first conductivity type, on the top surfaces of the active regions 120 of the second conductivity type, on the top surfaces of the gate lines 130, on the longitudinal sidewalls c1 and c2 of the first end of each of the gate lines 130, and on the transverse endwall "d" of the first end of each of the gate lines 130. Specifically, the silicide layer 170 is formed on exposed portions of the top surfaces of the active regions 110 of the first conductivity type and on exposed portions of the top surfaces of the active regions 120 of the second conductivity type that are not overlapped by the gate lines 130. In addition, the silicide layer 160 is formed on the top surfaces of the gate lines 130 and on the longitudinal sidewalls c1, c2, and on the transverse endwall d of the first end of each of the gate lines 130 on which the spacer 140 is not formed. Therefore, the silicide layer 160 surrounds the longitudinal sidewalls c1, c2, and endwall d of the first end of each of the gate lines 130. An etch stop layer 210 is conformally formed on the entire surface of a semiconductor substrate 100 having the silicide layers 160 and 170 formed thereon.

The gate lines 130 overlap portions of the active regions 110 of the first conductivity type 110 or the active regions 120 of the second conductivity type, thereby forming transistors. Transistors formed in portions where the gate lines 130 overlap the active regions 110 of the first conductivity type may be N-type transistors, e.g., pull-down transistors PD or pass transistors PS. Transistors formed in portions where the gate lines 130 overlap the active regions 120 of the second conductivity type may be P-type transistors, e.g., pull-up transistors PU. Six transistors indicated by reference characters PS, PU, and PD in FIG. 2A constitute each SRAM cell C.

Source/drain regions 150 are formed on both sides of portions where the active regions 110 of the first conductivity type or the active regions 120 of the second conductivity type are lapped (e.g., overlapped) by the gate lines 130. A plurality of first contacts 230 pass through an interlayer insulating layer 220 and through patterned etch stop layer 210 and are formed on portions of the source/drain regions 150. The first contacts 230 connect the source/drain regions 150 and upper wiring lines (not shown). Second contacts 240 pass through the interlayer insulating layer 220 and are formed on portions of the gate lines 130. A voltage on the wordline WL is applied to the gate lines 130 of the pass transistors PS through the second contacts 240.

The shared contacts 250 are conductors formed on the first ends of the gate lines 130 that are adjacent to (or overlapping) the active regions 120 of the second conductivity type and on the top surfaces of the active regions 120 of the second conductivity type. A pair of shared contacts 250 are formed on respective ends of a pair of adjacent active regions 120 of the second conductivity type. The shared contacts 250 are formed on the top surfaces of the active regions 120 of the second conductivity type and on the first ends of the gate lines 130. The share contacts 250 may be square or rectangular.

The first contacts 230, the second contacts 240, and the shared contacts 250 pass through the interlayer insulating layer 220. An etch stop layer 210 is formed between the interlayer insulating layer 220 and the semiconductor substrate 100 in regions where no contact is formed.

The silicide layers 160 and 170 are formed on the top surfaces of the active regions 110 of the first conductivity type, the top surfaces of the active regions 120 of the second conductivity type, and on the first ends of the gate lines 130. In particular, the silicide layer 160 is formed on the top surface and the sidewalls of the first end of each of the gate lines 130. In addition, the silicide layer 170 is formed on the top surfaces of the active regions 120 of the second conductivity type, up to portions thereof closest to the gate lines 130. The silicide layer 170 may even extend to under the gate lines 130. Therefore, although the shared contacts 250 are not formed large, the gate lines 130 and the active regions 120 of the second conductivity type can be easily electrically connected to each other. Furthermore, since the silicide layer 170 extends to regions closest to the gate lines 130 or to under the gate lines 130, the leakage of current between the gate lines 130 and the active regions 120 of the second conductivity type can be prevented. Consequently, the reliability of the semiconductor integrated circuit device can be enhanced.

A method of fabricating the semiconductor integrated circuit device according to the first exemplary embodiment of the present invention will now be described with reference to FIGS. 2A through 7B. FIGS. 4A through 7B are layout and cross-sectional diagrams for explaining a method of fabricating the semiconductor integrated circuit device according to the first exemplary embodiment of the present invention.

Figure 4A:
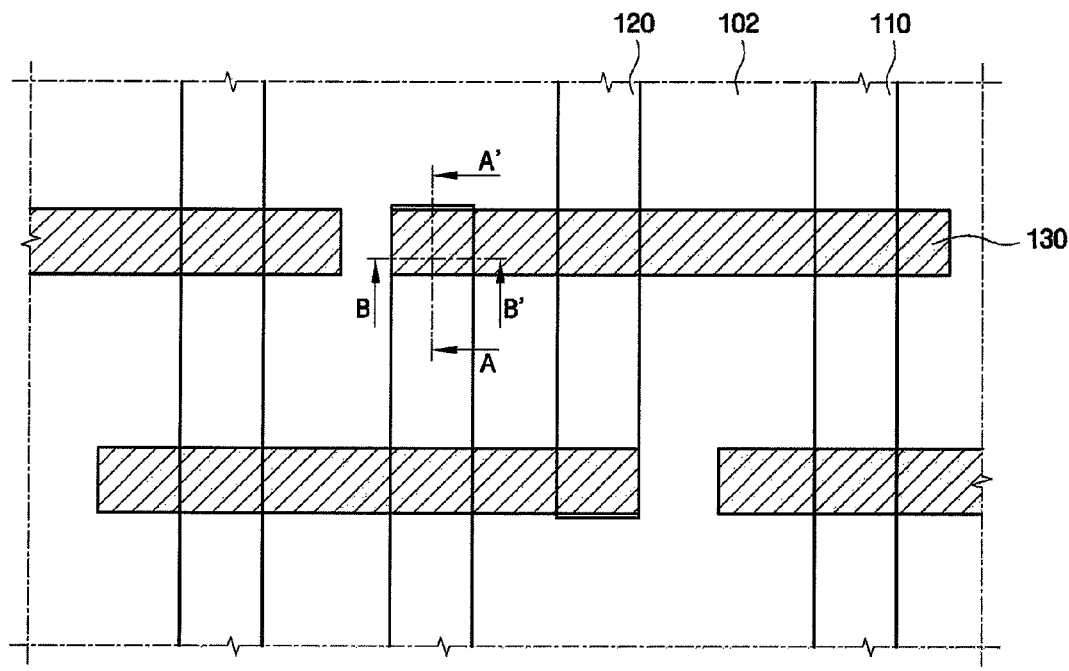
FIGS. 4A through 7B are layout and cross-sectional diagrams for explaining a method of fabricating the semiconductor integrated circuit (IC) memory device according to the first exemplary embodiment of the present invention.
Figure 4B:
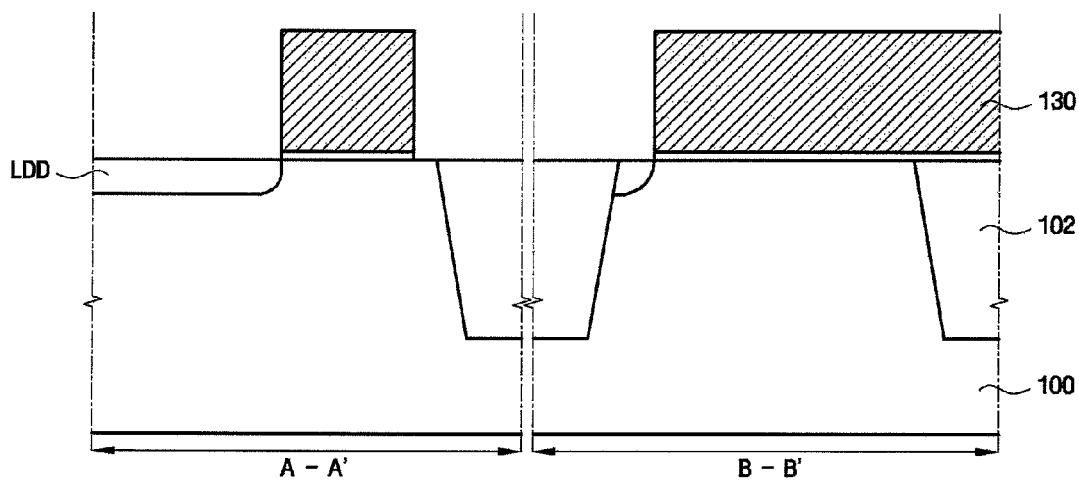

Referring to FIGS. 4A and 4B, element isolation regions 102 (e.g., trench isolation regions) are formed on or into the semiconductor substrate 100. Then, an ion implantation process is performed to form the active regions 110 of the first conductivity type and the active regions 120 of the second conductivity type which extend in the first direction. Next, the gate lines 130 are formed to cross the active regions 110 of the first conductivity type and the active regions 120 of the second conductivity type in the second direction. Here, an ion implantation process may also be performed to form lightly doped drain regions LDD.

Figure 5A:
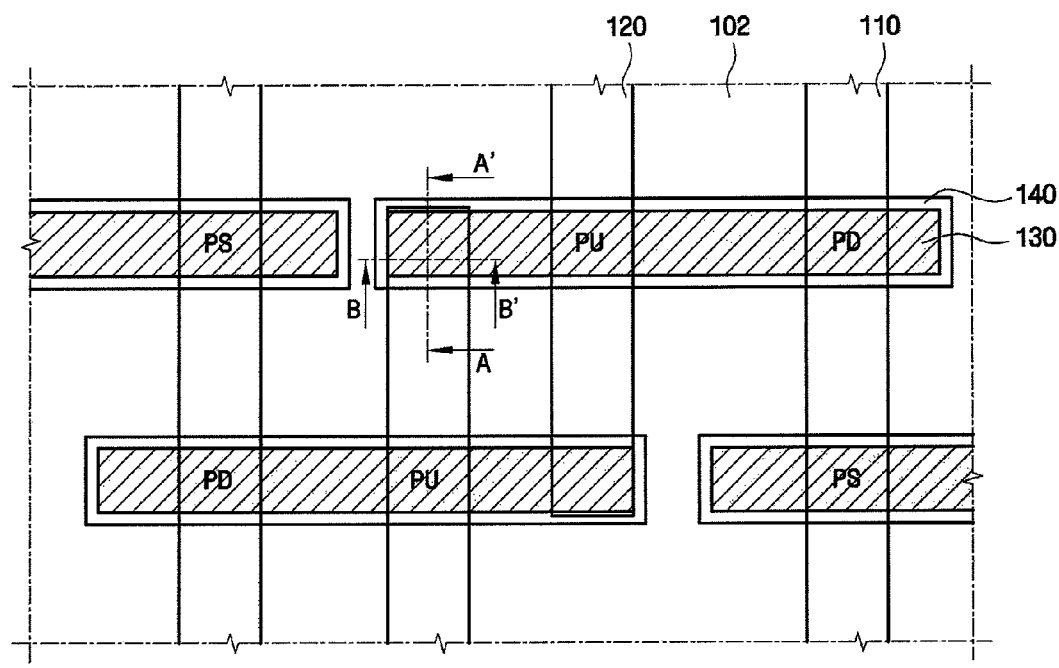
Figure 5B:
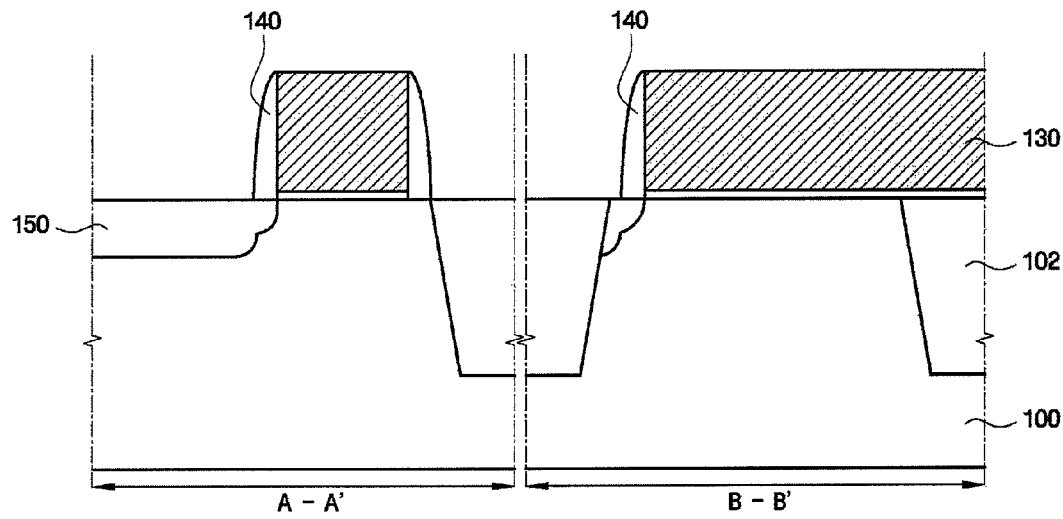

Referring to FIGS. 5A and 5B, the spacer 140 is formed on the vertical sidewalls and vertical endwalls of each of the gate lines 130. To form this spacer, an insulating layer is deposited on the entire surface of the semiconductor substrate 100 after the gate lines 130 have been formed. Then, an anisotropic etching process is performed to form the spacer 140 on the sidewalls of each of the gate lines 130. An ion implantation process may be performed to form the source/drain regions 150 by using the spacer 140 as an ion implantation mask.

Figure 6A:
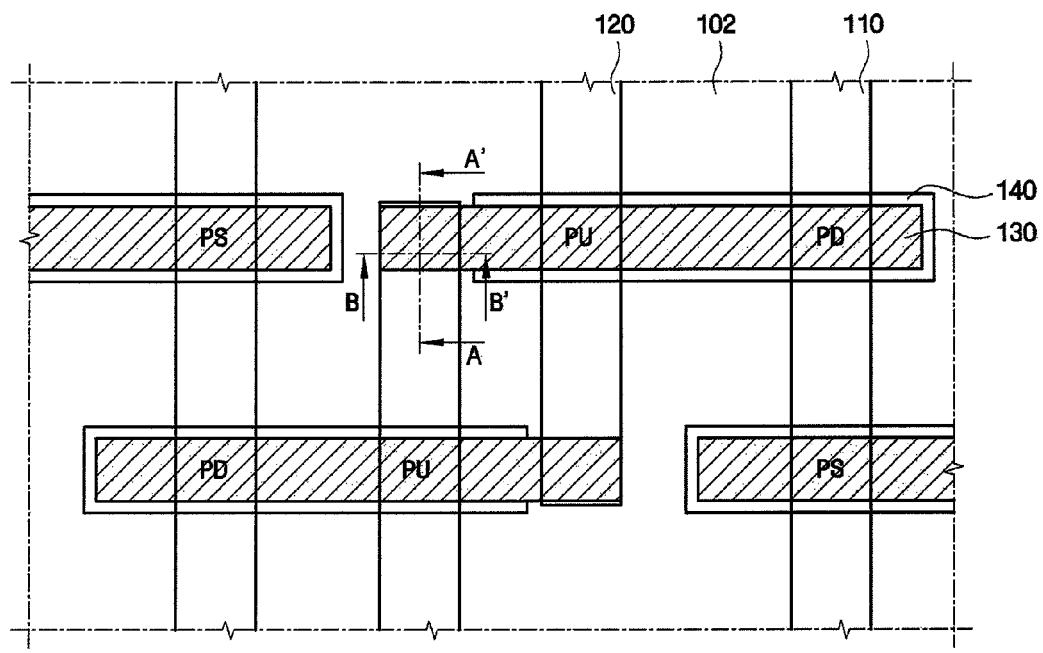
Figure 6B:
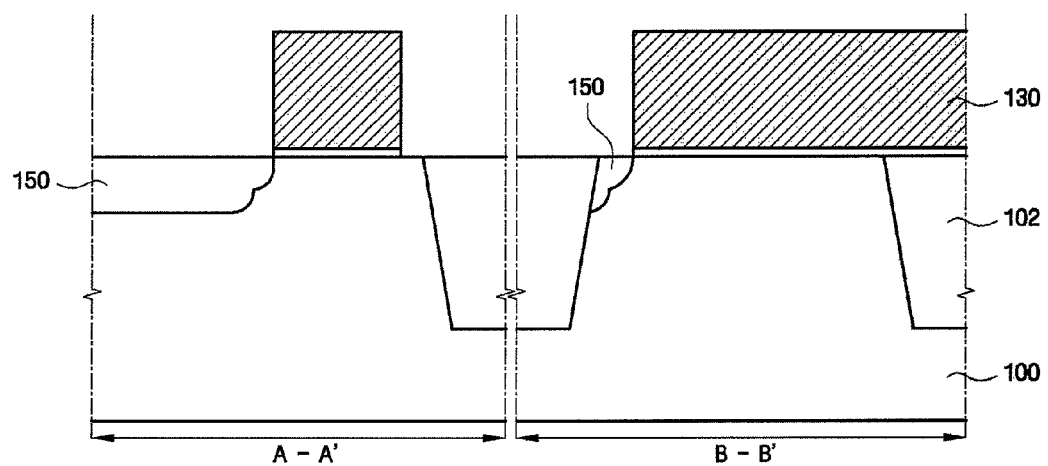

Referring to FIGS. 6A and 6B, the spacer 140 is removed from the first ends of some the gate lines 130.

Specifically, the spacer 140 is removed from regions of the first ends of the gate lines 130 that are adjacent to or overlap the active regions 120 of the second conductivity type. The spacer 140 may be removed from the first ends of the gate lines 130 by a photolithography process. Thus, a mask that opens a region from which the spacer 140 is to be removed is formed, and then the spacer 140 is removed within the opened region.

Figure 7A:
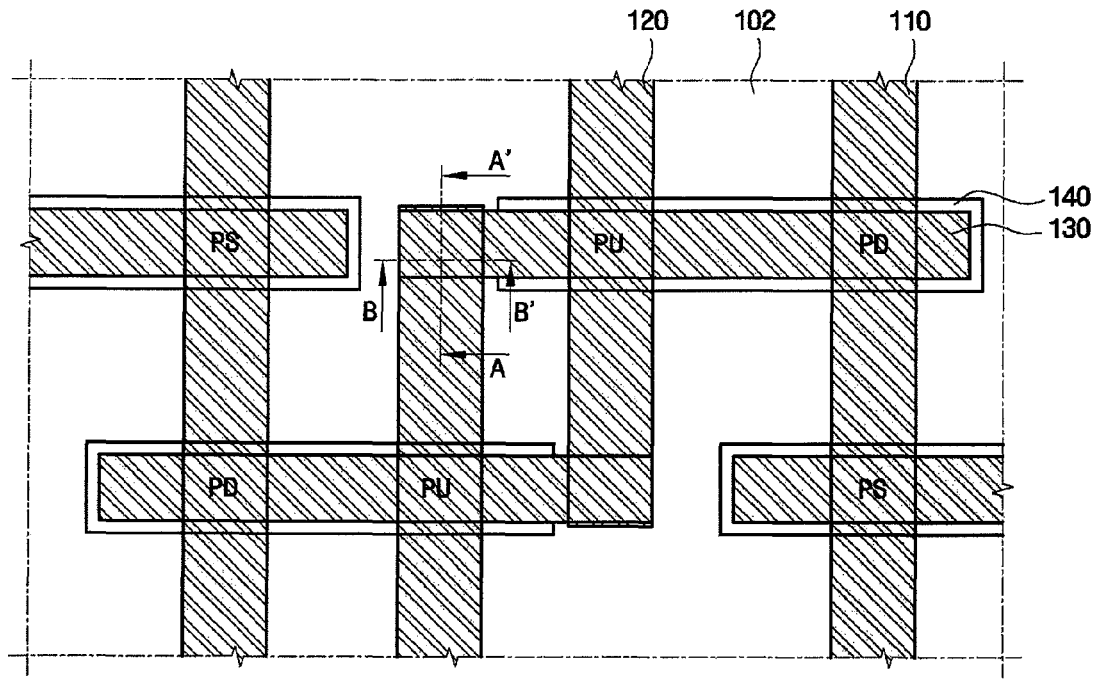
Figure 7B:
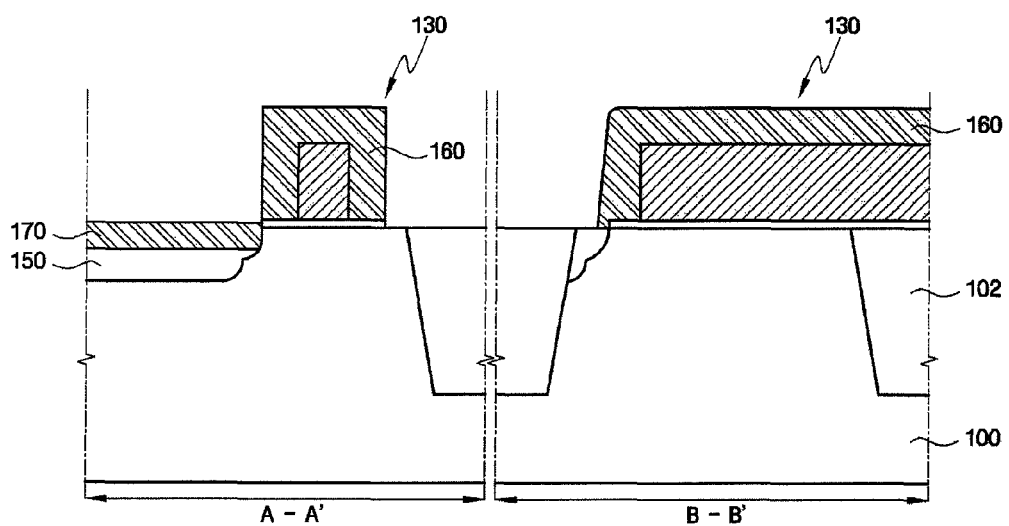

Referring to FIGS. 7A and 7B, a silicidation process is performed on the entire surface of the semiconductor substrate 100. The silicide layers 160 and 170 are formed on exposed portions of the active regions 110 of the first conductivity type, exposed portions of the active regions 120 of the second conductivity type, the top surfaces of the gate lines 130, and exposed sidewalls and endwall of the first end of the gate lines 130, i.e., both sidewalls of the first end of each of the gate lines 130 and the transverse endwall of the first end of each of the gate lines 130. Thus, since both sidewalls of the first end of each of the gate lines 130 and the transverse endwall of the first end of each of the gate lines 130 are exposed, they are silicidized, thereby forming a silicide layer.

The first contacts 230, the second contacts 240, and the shared contacts 250 are next formed on the semiconductor substrate 100 (see FIGS. 2A through 3B). After the etch stop layer 210 is deposited on the entire surface of the semiconductor substrate 100, the interlayer insulating layer 220 is deposited. Then, the interlayer insulating layer 220 is partially etched (patterned) to form contact holes. First contact holes in which the first contacts 230 are to be formed, second contact holes in which the second contacts 240 are to be formed, and shared contact holes in which the shared contacts 250 are to be formed do not significantly differ in their size. Therefore, the above contact holes may be patterned simultaneously in a single photolithography process. Alternatively, a separate photolithography process may be performed for each contact hole or only for the shared contact holes. Since the shared contacts 250 formed in the semiconductor integrated circuit device according to the first exemplary embodiment are not large, they may be formed at the same time as the first and second contact holes for the first contacts 230 and the second contacts 240. Next, the contact holes are filled to form the first contacts 230, the second contacts 240, and the shared contacts 250.

Hereinafter, a semiconductor integrated circuit device according to a second exemplary embodiment of the present invention will be described with reference to FIGS. 8A and 8B.

Figure 8A:
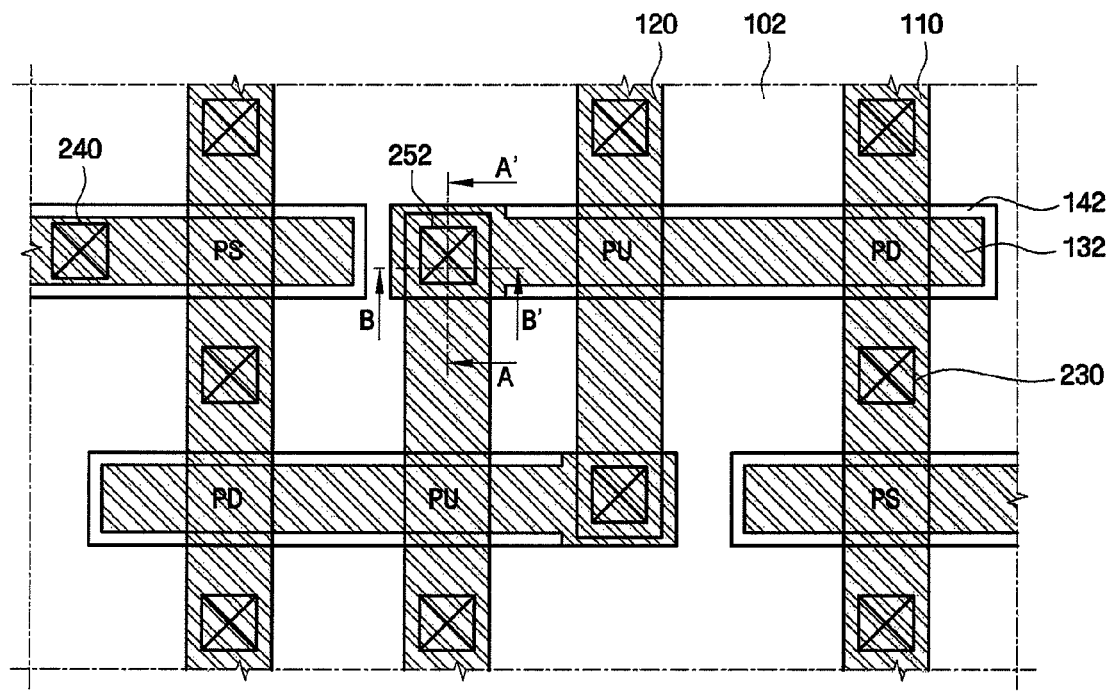
FIG. 8A is a layout diagram of an SRAM cell region included in a semiconductor integrated circuit device according to a second exemplary embodiment of the present invention.

FIG. 8A is a layout diagram of an SRAM cell region included in the semiconductor integrated circuit device according to the second exemplary embodiment of the present invention. FIG. 8B is a cross-sectional view of the SRAM cell region taken along the section lines A-A' and B-B' in FIG. 8A. For brevity, a redundant description of features and elements substantially identical to those of the first exemplary embodiment will be omitted.

Figure 8B:
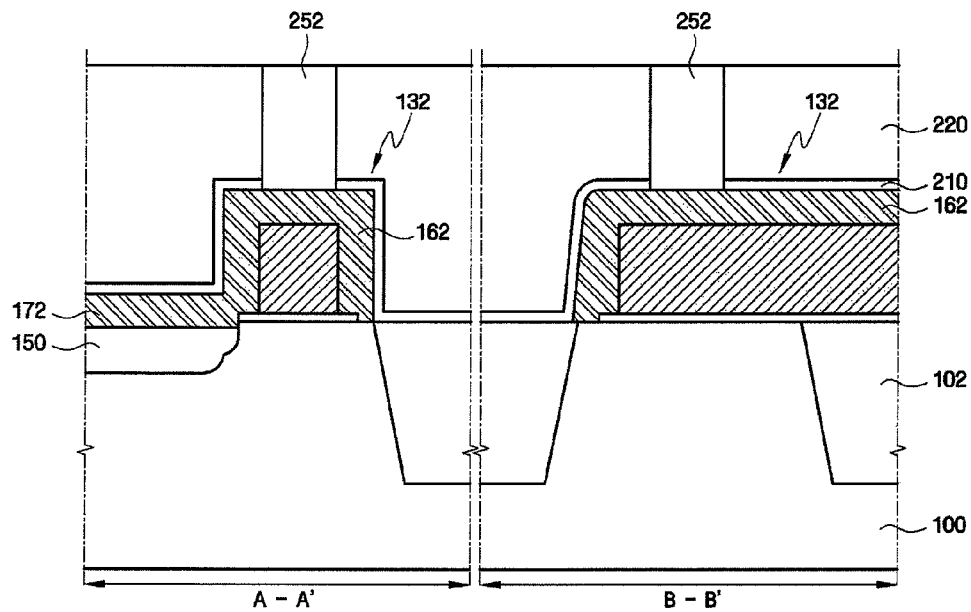
FIG. 8B is a cross-sectional view of the SRAM cell region taken along the section lines A-A' and B-B' in FIG. 8A.

Referring to FIGS. 8A and 8B, the semiconductor integrated circuit device according to the second exemplary embodiment is different from the semiconductor integrated circuit device according to the first exemplary embodiment in that silicide layers 162 and 172 formed on active regions 110 of a first conductivity type, on active regions 120 of a second conductivity type, and on exposed portions of a first end of each of gate lines 132 conform to top surface and vertical walls thereof, e.g., upward or sideways. In addition, an epitaxial layer may be partially formed under the silicide layers 162 and 172.

In the semiconductor integrated circuit device according to the second exemplary embodiment, the silicide layer 162 formed on sidewalls of each of the gate lines 132 is connected to the silicide layer 172 formed on one of the active regions 120 of the second conductivity type which is adjacent to or under the gate line 132.

In the semiconductor integrated circuit device according to the second exemplary embodiment, shared contacts 252 are formed only on the gate lines 132. Thus, the shared contacts 252 do not extend to the active regions 120 of the second conductivity type. In the semiconductor integrated circuit device according to the second exemplary embodiment, the gate lines 132 and the active regions 120 of the second conductivity type are electrically connected to each other by the silicide layers 162 and 172. Thus, although the shared contacts 252 are formed only on the gate lines 132, the gate lines 132 can be electrically connected to the active regions 120 of the second conductivity type by the silicide layers 162 and 172.

Accordingly, the size of the shared contacts 252 can be reduced to that of first contacts 230 or second contacts 240. Furthermore, since there is no need to form the shared contacts 252 on all of the gate lines 132 and the active regions 120 of the second conductivity type, the process of forming the 'shared' contracts 252 can be simplified.

A method of fabricating the semiconductor integrated circuit device according to the second exemplary embodiment of the present invention will now be described with reference to FIGS. 4A through 6B and 8A through 10B. FIGS. 9A through 10B are diagrams for explaining a method of fabricating the semiconductor integrated circuit device according to the second exemplary embodiment of the present invention.

Referring to FIGS. 4A through 6B, as in the method of fabricating the semiconductor integrated circuit device according to the first exemplary embodiment, in the method of fabricating the semiconductor integrated circuit device according to the second exemplary embodiment, the active regions 110 of the first conductivity type, the active regions 120 of the second conductivity type, the gate lines 132, and a spacer 142 are formed, and the spacer 142 is removed from the first end of each of the gate lines 132. Thus, a redundant detailed description of the above processes will be omitted.

Figure 9A:
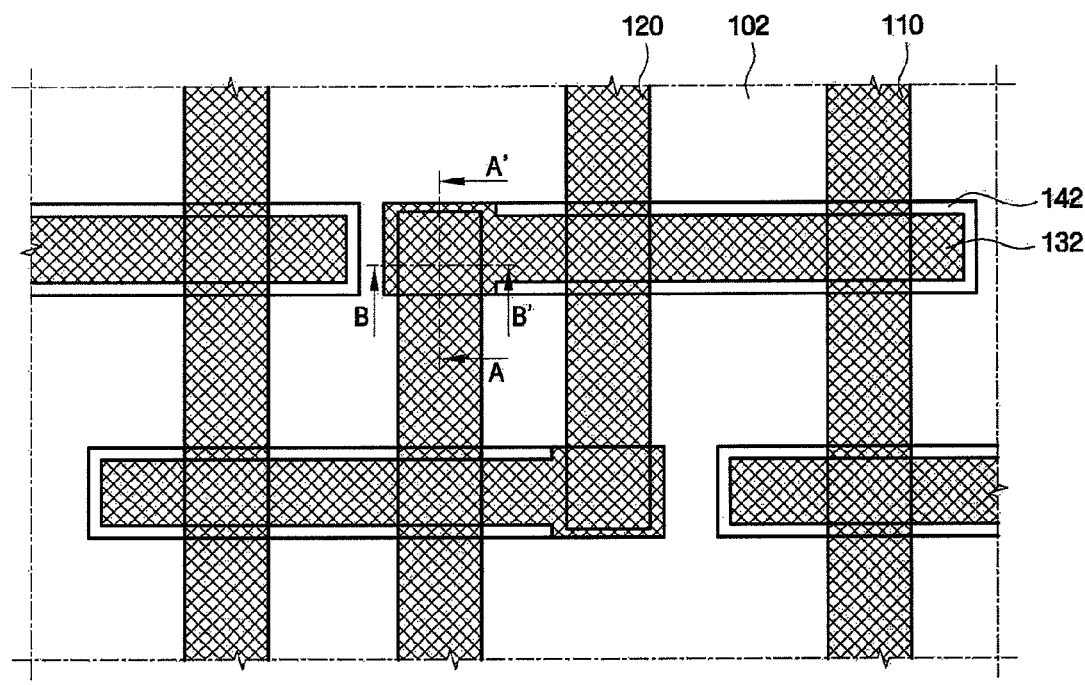
FIGS. 9A through 10B are diagrams for explaining a method of fabricating the semiconductor integrated circuit device according to the second exemplary embodiment of the present invention.
Figure 9B:
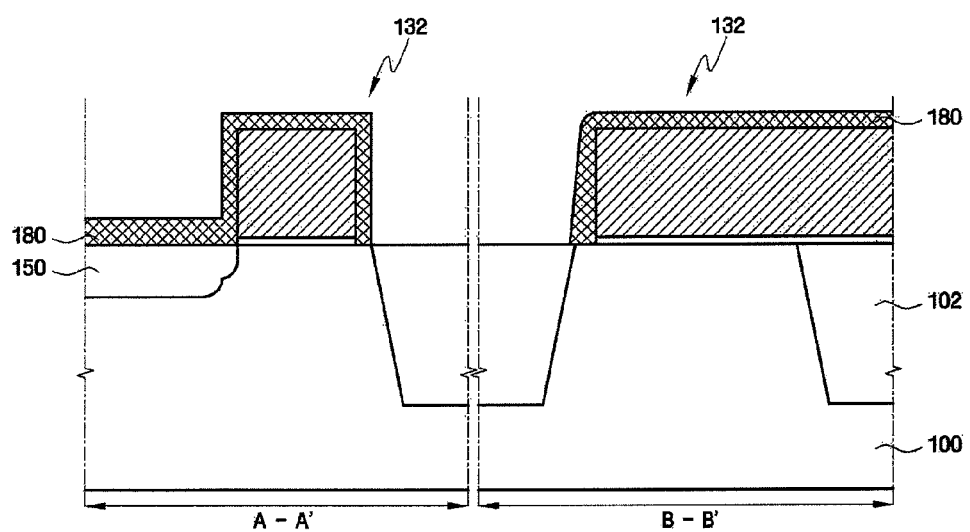

Referring to FIGS. 9A and 9B, a selective epitaxial growth (SEG) process is performed on the semiconductor substrate 100.

The SEG process may be, but is not limited to, a chemical vapor deposition (CVD) process, a reduced pressure chemical vapor deposition (RPCVD) process, or an ultra high vacuum chemical vapor deposition (UHVCVD) process. The SEG process may be performed by supplying a source gas. The source gas used here may be $SiH_4$, $SiH_2Cl_2$ (DCS), or $SiHCl_3$ (TCS). Impurities may also be doped in-situ in the SEG process or may be doped separately after the SEG process.

Then, an epitaxial layer 180 grows on exposed portions of the active regions 110 of the first conductivity type, exposed portions of the active regions 120 of the second conductivity type, top surfaces of the gate lines 132, and the sidewalls and endwall of the first end of each of the gate lines 132. The grown epitaxial layer 180 protrudes from top surfaces of the active regions 110 of the first conductivity type, top surfaces of the active regions 120 of the second conductivity type, and the top surfaces of the gate lines 132. In addition, the epitaxial layer 180 grows on both sidewalls and the endwall of the first end of each of the gate lines 132 in both directions, thereby protruding outwardly more than both ends of a gate insulating layer. Referring to FIG. 9B, the active regions 120 of the second conductivity type are connected to the gate lines 132 by the epitaxial layer 180.

The epitaxial layer 180 may be a mono-crystalline silicon layer, e.g., an SiGe layer.

Figure 10A:
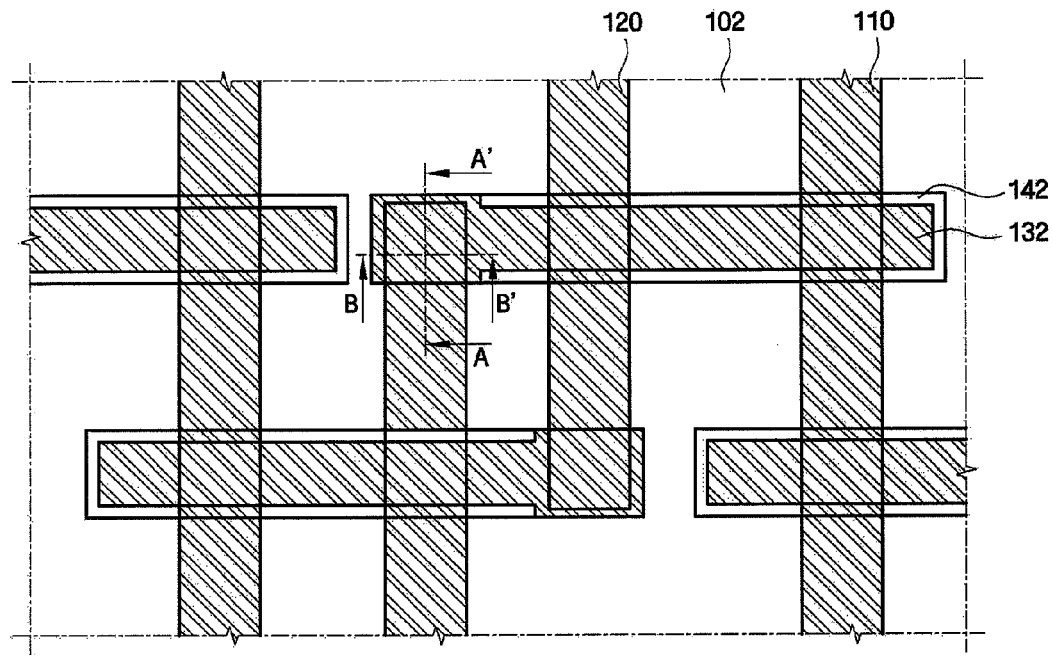
Figure 10B:
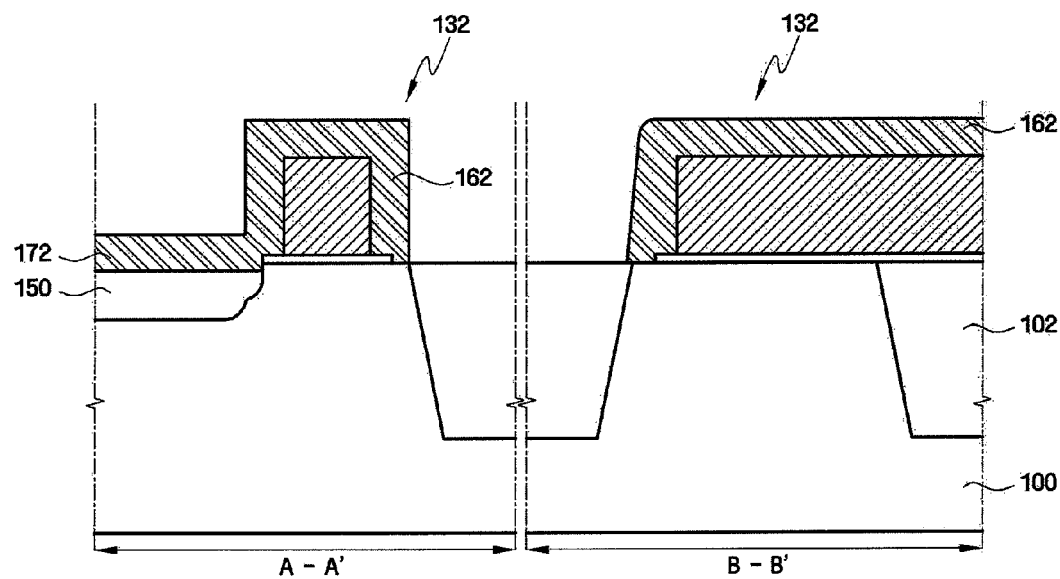

A silicide is a compound that has silicon with more electropositive elements. Silicon is more electropositive than carbon. The typical process for forming a silicide is to deposit thin films of a metal on silicon and then anneal the composite structure at high temperatures where the metal layer reacts with the silicon layer to create a silicide. Referring to FIGS. 10A and 10B, a silicidation process is performed on the entire surface of the semiconductor substrate 100. Then, the silicide layers 162 and 172 are formed on the exposed portions of the active regions 110 of the first conductivity type, the exposed portions of the active regions 120 of the second conductivity type, the top surfaces of the gate lines 132, and exposed sidewalls of the first end of each of the gate lines 132, i.e., both sidewalls of the first end of each of the gate lines 132 and a transverse endwall of the first end of each of the gate lines 132. Here, since the epitaxial layer 180 is a mono-crystalline silicon layer, it is also silicidized. Referring to FIGS. 10A and 10B, the epitaxial layer 180, portions of the gate lines 132, portions of the active regions 110 of the first conductivity type, and portions of the active regions 120 of the second conductivity type are silicidized, thereby forming the silicide layers 162 and 172. In FIGS. 10A and 10B, the entire thickness of the epitaxial layer 180 is silicidized. However, the present invention is not limited thereto, and part of the thickness of the epitaxial layer 180 may also remain, depending on the original thickness of the epitaxial layer 180. Referring to FIG. 10B, the silicide layer 162 formed on the active regions 120 of the second conductivity type is connected to the silicide layer 172 formed on the gate lines 132.

Referring back to FIGS. 8A and 8B, the first contacts 230, the second contacts 240, and the shared contacts 252 are formed on the semiconductor substrate 100. After an etch stop layer 210 is deposited on the entire surface of the semiconductor substrate 100, an interlayer insulating layer 220 is deposited. Then, the interlayer insulating layer 220 is partially etched (patterned) to form contact holes. First contact holes in which the first contacts 230 are to be formed, second contact holes in which the second contacts 240 are to be formed, and shared contact holes in which the shared contacts 250 are to be formed do not significantly differ in their size. Therefore, the above contact holes may be patterned simultaneously in a single photolithography process. Then, the above contact holes are filled with a conductor to form the first contacts 230, the second contacts 240, and the shared contacts 252. In the semiconductor integrated circuit device according to the second exemplary embodiment, the shared contacts 252 contact only the top surfaces of the gate lines 132. Thus, the shared contacts 252 do not extend to the active regions 120 of the second conductivity type.

Hereinafter, a semiconductor integrated circuit device according to a third exemplary embodiment of the present invention will be described with reference to FIGS. 11A and 11B.

Figure 11A:
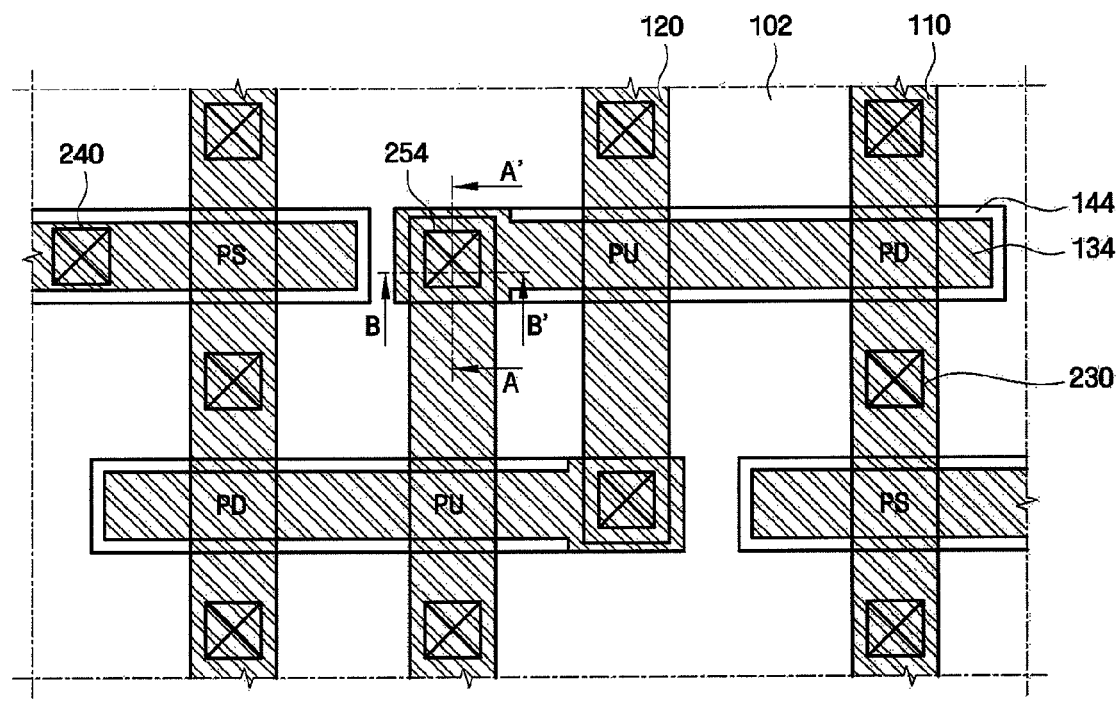
FIG. 11A is a layout diagram of an SRAM cell region included in a semiconductor integrated circuit device according to a third exemplary embodiment of the present invention.

FIG. 11A is a layout diagram of an SRAM cell region included in the semiconductor integrated circuit (IC) memory device according to the third exemplary embodiment of the present invention. FIG. 11B is a cross-sectional view of the SRAM cell region taken along the section lines A-A' and B-B' in FIG. 11A. For simplicity, a redundant description of features and elements substantially identical to those of the second exemplary embodiment will be omitted.

Figure 11B:
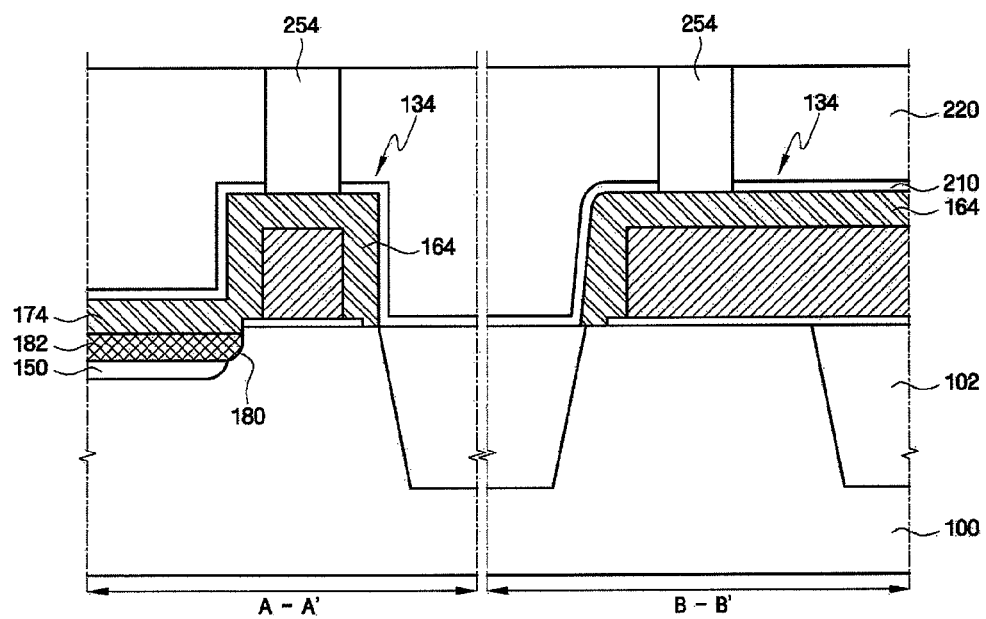
FIG. 11B is a cross-sectional view of the SRAM cell region taken along the section lines A-A' and B-B' in FIG. 11A.

Referring to FIGS. 11A and 11B, the semiconductor integrated circuit memory device according to the third exemplary embodiment is different from the semiconductor integrated circuit device according to the second exemplary embodiment in that recesses 182 are formed. The recesses 182 are formed by etching portions of active regions 120 of the second conductivity type, then an epitaxial layer 180 is formed to fill the recesses 182, and then silicide layers 164 an 174 are formed on the epitaxial layer 180 that fills the recesses 182.

The recesses 182 may be formed by etching source/drain regions 150 of a semiconductor substrate 100, for example, by etching exposed portions of the active regions 120 of the second conductivity type. Thus, the recesses 182 may be formed only in the source/drain regions 150 in areas where PMOS transistors are to be formed. If an SEG process is performed after the recesses 182 are formed in the source/drain regions 150 in the areas where PMOS transistors are to be formed, characteristics of the PMOS transistors can be enhanced. In the semiconductor integrated circuit device according to the third exemplary embodiment, the recesses 182 are formed in the source/drain regions 150 in the areas where PMOS transistors are to be formed, and then an SEG process is performed. Therefore, characteristics of the PMOS transistors can be enhanced, and, at the same time, the active regions 120 of the second conductivity type can be connected to the gate lines 134.

As in the semiconductor integrated circuit device according to the second exemplary embodiment, in the semiconductor integrated circuit (IC) memory device according to the third exemplary embodiment, the silicide layer 164 formed on sidewalls of each of the gate lines 134 is connected to the silicide layer 174 formed on one of the active regions 120 of the second conductivity type where adjacent to the gate line 134. In addition, shared contacts 254 are formed only on the gate lines 134. Thus, the shared contacts 254 do not extend to/over the active regions 120 of the second conductivity type.

Hereinafter, a semiconductor integrated circuit device according to a fourth exemplary embodiment of the present invention will be described with reference to FIGS. 12A and 12B.

Figure 12A:
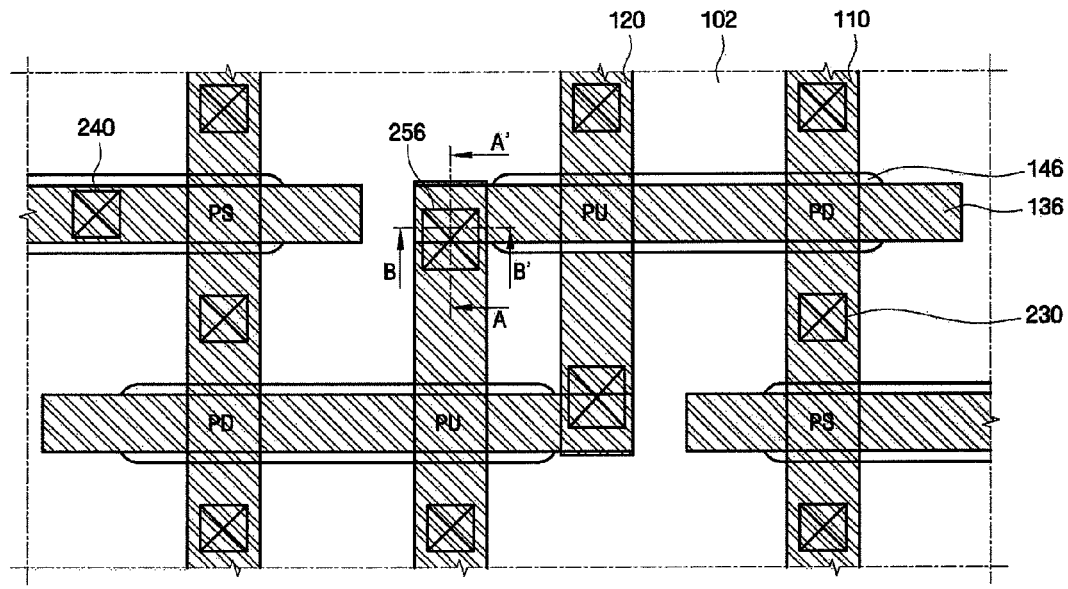
FIG. 12A is a layout diagram of an SRAM cell region included in a semiconductor integrated circuit device according to a fourth exemplary embodiment of the present invention.

FIG. 12A is a layout diagram of an SRAM cell region included in the semiconductor integrated circuit device according to the fourth exemplary embodiment of the present invention. FIG. 12B is a cross-sectional view of the SRAM cell region taken along the section lines A-A' and B-B' in FIG. 12A. For simplicity, a redundant description of features and elements substantially identical to those of the first exemplary embodiment will be omitted.

Figure 12B:
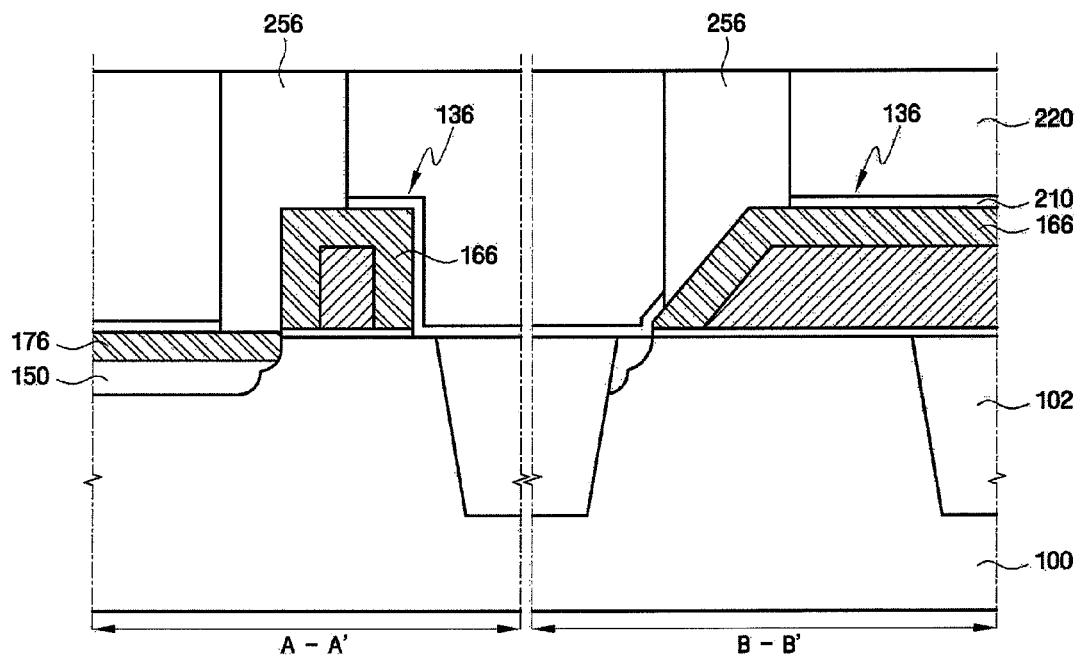
FIG. 12B is a cross-sectional view of the SRAM cell region taken along the section lines A-A' and B-B' in FIG. 12A.

Referring to FIGS. 12A and 12B, the semiconductor integrated circuit device according to the fourth exemplary embodiment is different from the semiconductor integrated circuit device according to the first exemplary embodiment in that a transverse endwall of a first end of each of gate lines 136 or transverse endwalls of first and second ends thereof is/are at an angle of 87 degrees or less with respect to a semiconductor substrate 100.

Thus, not only the transverse endwall of the first end of each of the gate lines 136, which is adjacent to one of shared contacts 256, but also the transverse endwall of the second end of each of the gate lines 136 may be at an angle of 87 degrees or less with respect to the semiconductor substrate 100. When the transverse endwall or sidewalls of the first end or the first and second ends of each of the gate lines 136 are at an angle of 87 degrees or less with respect to the semiconductor substrate 100, the slope thereof is 87 degrees or less.

In the semiconductor integrated circuit device according to the fourth exemplary embodiment, a spacer 146 is formed on both sidewalls of each of the gate lines 136. The spacer 146 is formed on portions of both sidewalls of each of the gate lines 136 which are at a gentle angle to the semiconductor substrate 100, excluding the first end or the first and second ends thereof.

Silicide layers 166 and 176 are formed on top surfaces of active regions 110 of a first conductivity type, top surfaces of active regions 120 of a second conductivity type, top surfaces of the gate lines 136, both sidewalls of the first end or the first and second ends of each of the gate lines 136, and the transverse endwall or endwalls of the first end or the first and second ends of each of the gate lines 136.

A method of fabricating the semiconductor integrated circuit device according to the fourth exemplary embodiment of the present invention will now be described with reference to FIGS. 12A through 16B.

FIGS. 13A through 16B are layout and cross-sectional diagrams for explaining a method of fabricating the semiconductor integrated circuit device according to the fourth exemplary embodiment of the present invention.

Figure 13A:
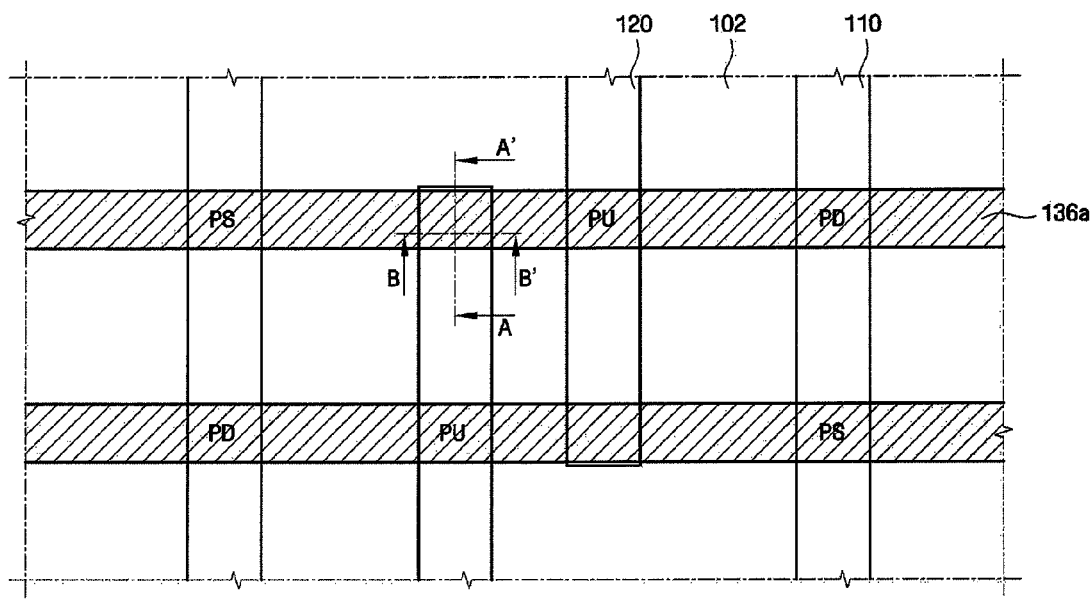
FIGS. 13A through 16B are diagrams for explaining a method of fabricating the semiconductor integrated circuit device according to the fourth exemplary embodiment of the present invention.
Figure 13B:
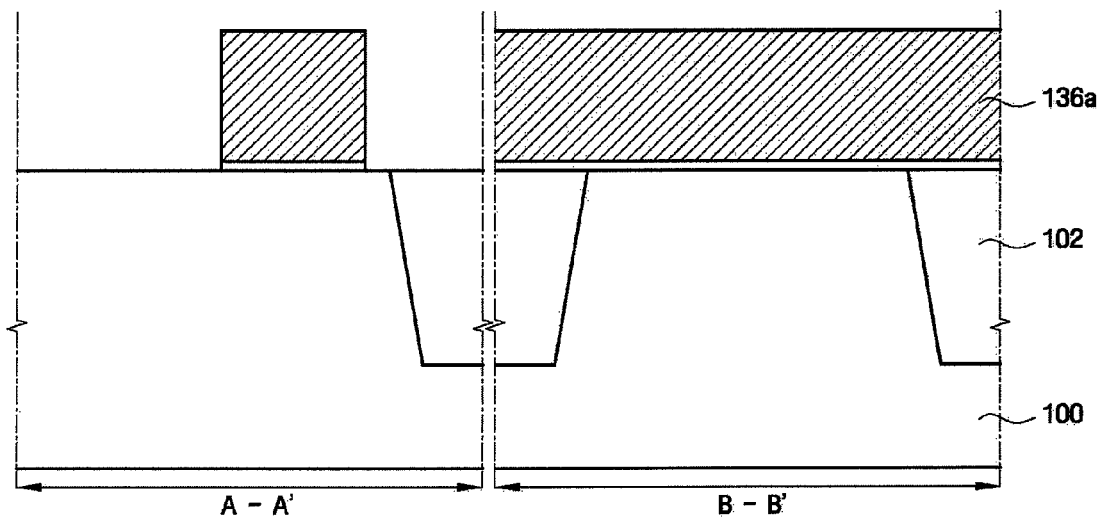

Referring to FIGS. 13A and 13B, element isolation (trench) regions 102 are formed on/into the semiconductor substrate 100. Then, an ion implantation process is performed to form the active regions 110 of the first conductivity type and the active regions 120 of the second conductivity type which extend in a first direction. Next, a gate conductive layer is formed on the semiconductor substrate 100, and a first gate patterning process is performed.

In the first gate patterning process, the gate conductive layer is patterned in a line-and-space form that crosses the active regions 110 of the first conductivity type and the active regions 120 of the second conductivity type in a second direction. Thus, a conductive layer pattern 136a is formed in a line-and-space form to extend in the second direction by using a mask in a line-and-space form. Here, processing conditions are controlled to make the sidewalls of the gate lines 136 ideally at a right angle (vertical) to the plane of the semiconductor substrate 100.

Figure 14A:
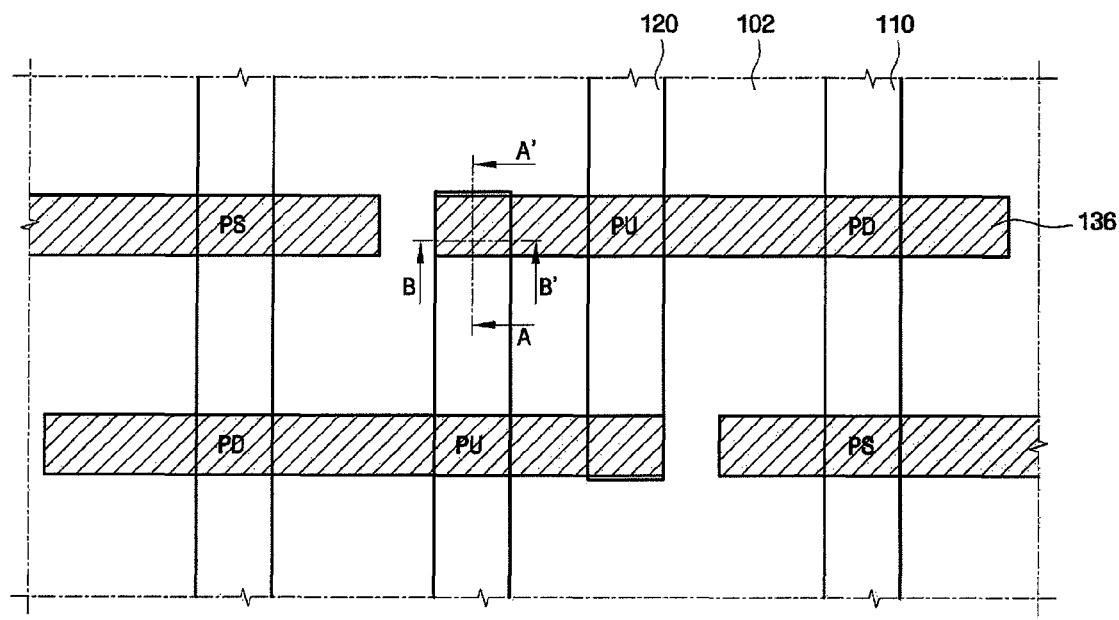
Figure 14B:
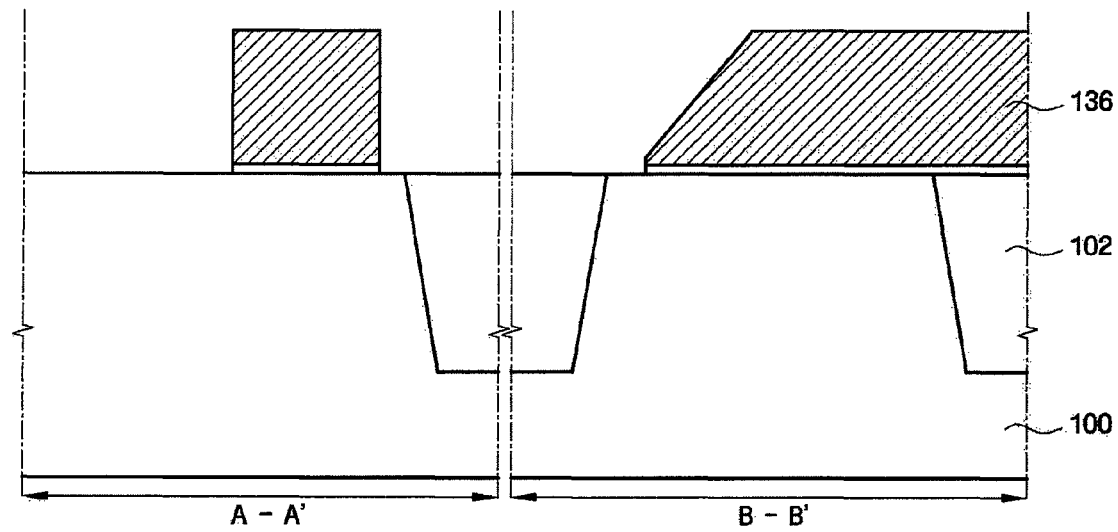

Referring to FIGS. 14A and 14B, a second gate patterning process is performed. In the second gate patterning process, the conductive layer pattern 136a, which is in a line-and-space form and extends in the second direction, is patterned such that the conductive line is cut into predetermined lengths. The resultant gate lines 136 having the predetermined length are separated from each other by a predetermined gap in the second direction. In addition, vertical endwalls of the gate lines 136, which are adjacent to each other in the first direction, are not parallel to each other.

In the second patterning process, etching conditions are controlled such that the vertical endwalls of the gate lines 136 formed as a result of patterning the conductive layer pattern 136a are at an angle of 87 degrees or less with respect to the semiconductor substrate 100. Thus, the vertical endwalls of the gate lines 136 formed as a result of patterning the conductive layer pattern 136a may have a gentle slope. The second gate patterning process may be performed under the following conditions. An etching process may be performed by supplying an HBr gas, an F2 gas, and an O2 gas under a pressure of 1 to 100 mTorr. When the O2 gas is supplied together with other etching gases, a polymer is formed and attached to the vertical sections of the gate lines 136. Therefore, the vertical endwalls of the gate lines 136 may be tapered to have a gentle slope.

Figure 15:
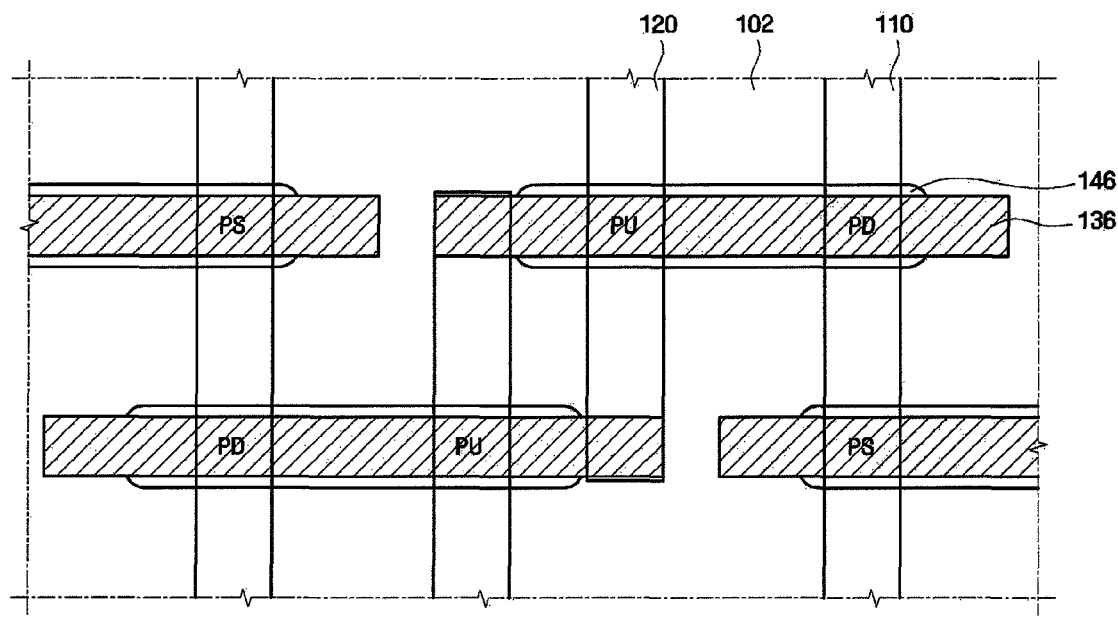

Referring to FIG. 15, the spacer 146 is formed on the vertical sidewalls of the gate lines 136. Specifically, an insulating layer is deposited on the entire surface of the semiconductor substrate 100. Then, an anisotropic etching process is performed to leave the spacer 146 on the vertical sidewalls of each of the gate lines 136.

Once the anisotropic etching process is performed to form the spacer 146, the insulating layer is removed from all flat regions of the surface of the semiconductor substrate 100. Accordingly, the insulating layer remains only in regions sloping at a large vertical angle, such as the vertical sidewalls of the gate lines 136. Since the vertical endwall of the gate lines 136 included in the semiconductor integrated circuit device according to the fourth exemplary embodiment have a gentle slope, the insulating layer is removed from the entire vertical endwalls of the gate lines 136. Thus, the spacer 146 is not formed on the first and second ends of each of the gate lines 136 but is formed on the vertical sidewalls of each of the gate lines 136.

Next, an ion implantation process may be performed to form source/drain regions 150 by using the spacer 146 as an ion implantation mask.

Figure 16A:
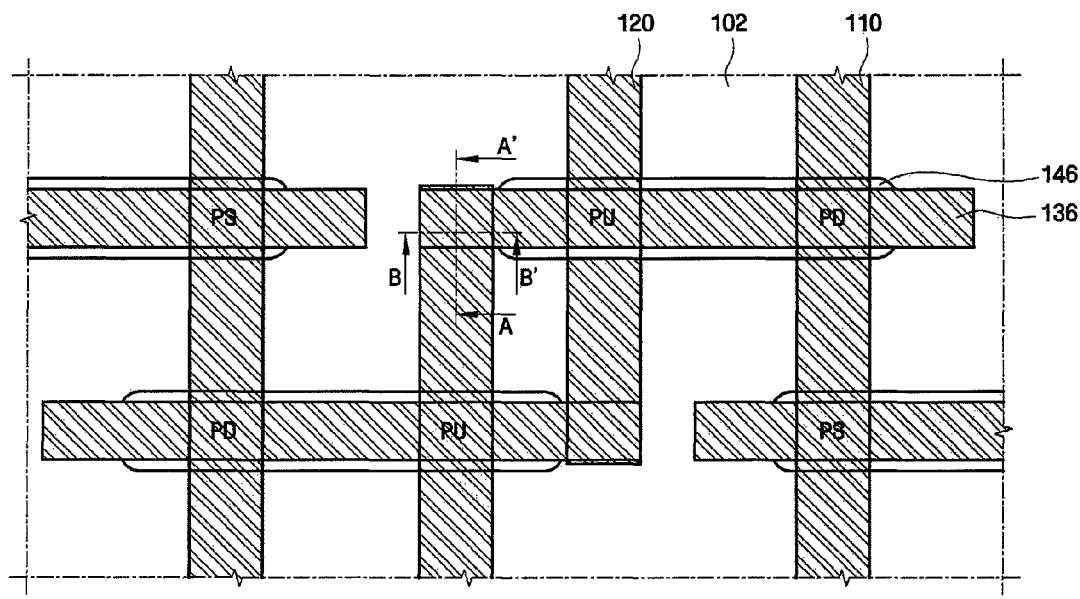
Figure 16B:
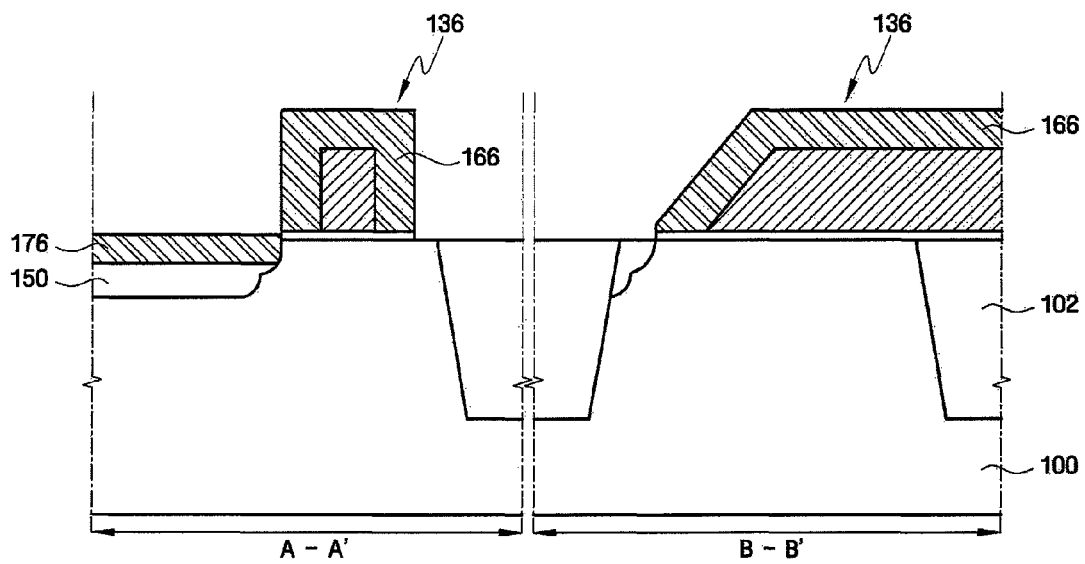

Referring to FIGS. 16A and 16B, a silicidation process is performed on the entire surface of the semiconductor substrate 100. Then, the silicide layers 166 and 176 are formed (patterned) on exposed portions of the active regions 110 of the first conductivity type, exposed portions of the active regions 120 of the second conductivity type, the top surfaces of the gate lines 136, and exposed vertical sidewalls of the first and second ends of each of the gate lines 136, i.e., both vertical sidewalls of the first and second ends of each of the gate lines 136 and the transverse endwalls of the first and second ends of each of the gate lines 136.

Referring back to FIGS. 12A and 12B, first contacts 230, second contacts 240, and the shared contacts 256 are formed on the semiconductor substrate 100.

After an etch stop layer 210 is deposited on the entire surface of the semiconductor substrate 100, an interlayer insulating layer 220 is deposited. Then, the interlayer insulating layer 220 is partially etched (patterned) to form contact holes. First contact holes in which the first contacts 230 are to be formed, second contact holes in which the second contacts 240 are to be formed, and shared contact holes in which the shared contacts 250 are to be formed do not significantly differ in their size, and thus have substantially the same size. Therefore, the above contact holes may be patterned simultaneously in a single photolithography process. Alternatively, a separate photolithography process may be performed for each contact hole or only for the shared contact holes. Since the shared contacts 256 formed in the semiconductor integrated circuit device according to the fourth exemplary embodiment are not large, they may be formed at the same time as the first and second contact holes for the first contacts 230 and the second contacts 240. Next, the above contact holes are filled to form the first contacts 230, the second contacts 240, and the shared contacts 250. The shared contacts 250 may be square or rectangular.

Hereinafter, a semiconductor integrated circuit device according to a fifth exemplary embodiment of the present invention will be described with reference to FIGS. 17A and 17B.

Figure 17A:
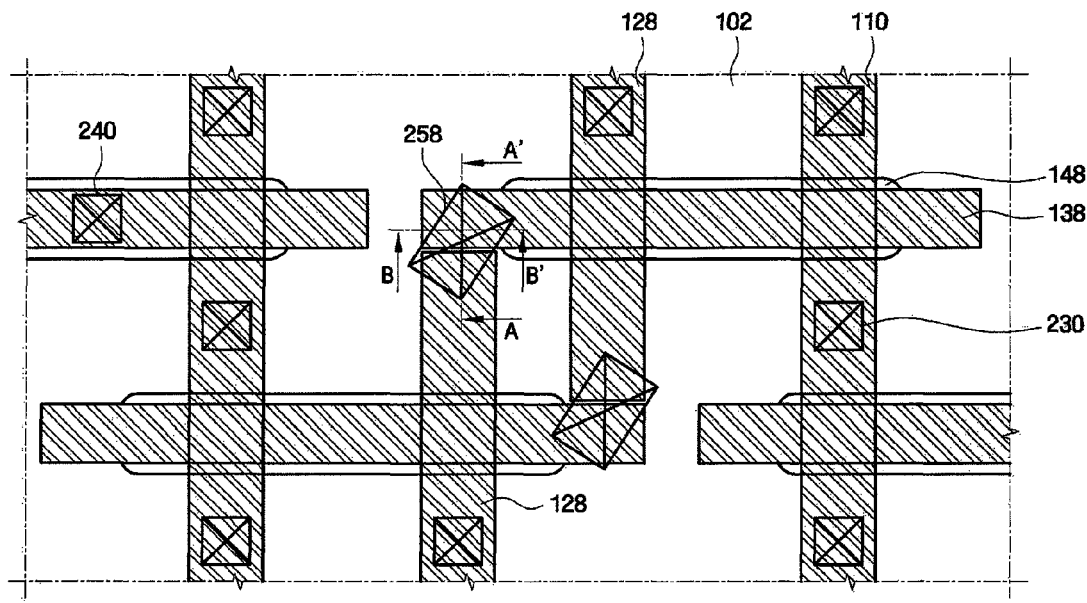
FIG. 17A is a layout diagram of an SRAM cell region included in a semiconductor integrated circuit device according to a fifth exemplary embodiment of the present invention.

FIG. 17A is a layout diagram of an SRAM cell region included in the semiconductor integrated circuit (IC) memory device according to the fifth exemplary embodiment of the present invention. FIG. 17B is a cross-sectional view of the SRAM cell region taken along the section lines A-A' and B-B' in FIG. 17A. For simplicity, a redundant description of features and elements substantially identical to those of the fourth exemplary embodiment will be omitted.

Figure 17B:
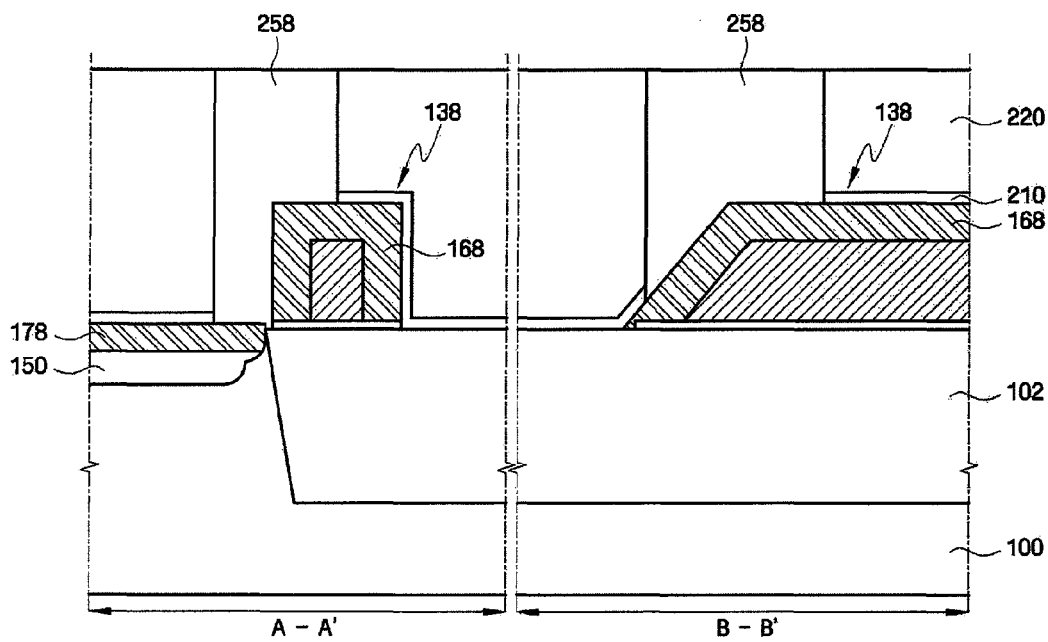
FIG. 17B is a cross-sectional view of the SRAM cell region taken along the section lines A-A' and B-B' in FIG. 17A.

Referring to FIGS. 17A and 17B, the semiconductor integrated circuit device according to the fifth exemplary embodiment is different from the semiconductor integrated circuit device according to the fourth exemplary embodiment in that active regions 128 of a second conductivity type are not overlapped by first ends of gate lines 138. Thus, since the active regions 128 of the second conductivity type included in the semiconductor integrated circuit device according to the fifth exemplary embodiment are not overlapped by the first ends of the gate lines 138, they are shorter than the active regions 120 of the second conductivity type included in the semiconductor integrated circuit device according to the fourth exemplary embodiment.

If the active regions 128 of the second conductivity type overlapped by the gate lines 138, silicide layers 168 and 178 are not formed on portions of the active regions 128 of the second conductivity type that are overlapped by the gate lines 138. Accordingly, current may leak to the portions of the active regions 128 of the second conductivity type, on which the silicide layers 168 and 178 are not formed, at the interface between the active regions 128 of the second conductivity type and the gate lines 13. However, in the semiconductor integrated circuit device according to the fifth exemplary embodiment, since the active regions 128 of the second conductivity type are not overlapped by the gate lines 138, the leakage of current can be reduced, thereby enhancing the reliability of the semiconductor integrated circuit device. In addition, in the semiconductor integrated circuit device according to the fifth exemplary embodiment, a spacer 148 is not formed on first and second ends of each of the gate lines 138. Instead, the silicide layer 168 is formed on first and second ends of each of the gate lines 138. Therefore, although the active regions 128 of the second conductivity type and the gate lines 138 do not lap each other, they are formed sufficiently adjacent to each other. In addition, shared contacts 258 can be easily connected to the active regions 128 of the second conductivity type and the gate lines 138. Thus, a misalignment risk is small.

Each of the rectangular shared contacts 258 included in the semiconductor integrated circuit device according to the fifth exemplary embodiment has a long axis and a short axis. A long-axis direction of the shared contacts 258 is at an angle of 20 to 70 degrees with respect to the direction in which the active regions 128 of the second conductivity type extend. Thus, the shared contacts 258 are formed obliquely with respect to first and second directions. When the shared contacts 258 are disposed obliquely with respect to the first and second directions, a gap between adjacent ones of the shared contacts 258 is increased. Consequently, the adjacent ones of the shared contacts 258 can be prevented from being bridged and thus preventing short-circuiting, thereby significantly enhancing the reliability of the semiconductor integrated circuit device.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A semiconductor integrated circuit device comprising:
   a gate line that extends in a first direction and has a first end and a second end and a first side and a second side;
   an active region adjacent to the first end of the gate line and that extends in a second direction;
   a silicide layer formed on a top surface of the active region, on a top surface of the gate line, on both sidewalls at the first end of the gate line, and on a transverse endwall at the first end of the gate line;
   a spacer formed on sidewalls of the gate line, but not on the sidewalls at the first end of gate line; and
   a shared contact formed on the first end of the gate line.

2. The circuit device of claim 1, wherein the shared contact is square.

3. The circuit device of claim 1, further comprising an epitaxial layer formed on the top surface of the active region, on the top surface of the gate line, and on both sidewalls at the first end of the gate line, and on the transverse endwall at the first end of the gate line, wherein the epitaxial layer formed on the top surface of the active region is connected to the epitaxial layer formed on the first end of the gate line, and the silicide layer is formed on the epitaxial layer.

4. The circuit device of claim 1, wherein the transverse endwall of the first end of the gate line is at an angle of 87 degrees or less with respect to the plane of a substrate.

5. The device of claim 3, further comprising a recess formed in the active region, wherein the recess is not overlapped by the gate line, and is filled with the epitaxial layer.

6. The circuit device of claim 5, wherein the shared contact is formed on the epitaxial layer on the gate line and is not formed on the active region.

7. The circuit device of claim 6, wherein the shared contact is square.

8. The circuit device of claim 6, wherein the shared contact has a long axis and a short axis, wherein a long-axis direction of the shared contact is at an angle of 20 to 70 degrees with respect to the second direction in which the active region extends, and a vertical section of the first end of the gate line does not overlap the active region.

9. A semiconductor integrated circuit device comprising:
   a substrate in which an element isolation region and an active region are formed;
   a gate insulating layer formed on the substrate;
   a gate electrode formed on the gate insulating layer;
   a silicide layer formed on the active region and on both sidewalls and on a top surface of the gate electrode; and
   a shared contact formed on the gate electrode and electrically connected to the active region and to the gate electrode, wherein the silicide layer protrudes upward from the active region and protrudes outwardly more than both ends of the gate insulating layer, and the silicide layer on the active region is connected to the silicide layer formed on the sidewalls of the gate electrode.

10. The circuit device of claim 9, further comprising a recess formed in a source/drain region of the active region and that contains an epitaxial layer and a silicide layer formed on the epitaxial layer.

11. A semiconductor memory integrated circuit comprising:
   a gate line that extends in a first direction and has a first end and a second end and a first side and a second side;
   an active region that extends in a second direction;
   a silicide layer formed conformally on a top surface of the active region, on a top surface of the gate line, on both sidewalls at the first end of the gate line, and on a transverse endwall at the first end of the gate line;
   a contact formed on the gate line electrically connected to the active region through the silicide layer.

12. The circuit device of claim 11, wherein the shared contact is square.

13. The circuit device of claim 11, wherein the active region is overlapped by the first end of the gate line.

14. The circuit device of claim 11, further comprising a first contact formed on the source of a transistor formed in the active region, wherein the size of the shared contact is substantially the same as the size of the first contact.

* * * * *